United States Patent
Lee et al.

(10) Patent No.: US 11,544,956 B2
(45) Date of Patent: Jan. 3, 2023

(54) INPUT SENSING DEVICE AND A DISPLAY DEVICE INCLUDING THE SAME

(71) Applicant: SAMSUNG DISPLAY CO., LTD., Yongin-si (KR)

(72) Inventors: Hyo Chul Lee, Yongin-si (KR); Hyeon Do Park, Yongin-si (KR); In Soo Wang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/189,965

(22) Filed: Mar. 2, 2021

(65) Prior Publication Data

US 2021/0326558 A1    Oct. 21, 2021

(30) Foreign Application Priority Data

Apr. 17, 2020  (KR) .......................... 10-2020-0046967

(51) Int. Cl.
| | | |
|---|---|---|
| *G06V 10/12* | (2022.01) | |
| *G06V 10/147* | (2022.01) | |
| *G06V 40/13* | (2022.01) | |
| *H01L 25/18* | (2006.01) | |
| *H01L 25/16* | (2006.01) | |

(52) U.S. Cl.
CPC ........ *G06V 40/1318* (2022.01); *G06V 10/147* (2022.01); *H01L 25/167* (2013.01); *H01L 25/18* (2013.01)

(58) Field of Classification Search
CPC .. G06V 40/1318; G06V 10/147; G06F 3/042; H01L 25/18
See application file for complete search history.

(56) References Cited

U.S. PATENT DOCUMENTS

| | | | |
|---|---|---|---|
| 10,599,908 B2 | 3/2020 | Jung et al. | |
| 2021/0200354 A1* | 7/2021 | Kang | ........................ G06F 3/044 |
| 2021/0289155 A1* | 9/2021 | Sekine | ................. H04N 5/3651 |

FOREIGN PATENT DOCUMENTS

| | | | |
|---|---|---|---|
| CN | 109994063 A | * 7/2019 | ................ G01J 1/44 |
| KR | 10-2018-0046788 | 5/2018 | |

\* cited by examiner

*Primary Examiner* — Lixi C Simpson
(74) *Attorney, Agent, or Firm* — F. Chau & Associates, LLC

(57) ABSTRACT

An input sensing device including: a power line; driving lines; a first signal line including sub-lines; a second signal line connected to the sub-lines; and sensor pixels connected to the power line, the driving lines, and the first signal line, wherein at least one sensor pixel of the sensor pixels includes: an optical sensor that transfers a photoelectrically converted charge from the power line to a first node in response to a driving signal provided through a first driving line of the driving lines; a first transistor connected between the first node and a first sub-line among the sub-lines, wherein the first transistor includes a gate electrode connected to the first driving line; and a second transistor connected between the first node and a second sub-line among the sub-lines, wherein the second transistor includes a gate electrode connected to the first driving line.

12 Claims, 14 Drawing Sheets

INPUT SENSING DEVICE AND A DISPLAY DEVICE INCLUDING THE SAME

CROSS-REFERENCE TO RELATED APPLICATION

This application claims priority under 35 U.S.C. § 119 to Korean Patent Application No. 10-2020-0046967 filed in the Korean Intellectual Property Office on Apr. 17, 2020, the disclosure of which is incorporated by reference herein in its entirety.

1. TECHNICAL FIELD

An exemplary embodiment of the present invention relates to an input sensing device and a display device including the same.

2. DESCRIPTION OF THE RELATED ART

Biometric authentication is form of security that measures and matches biometric features of a user to verify that a person trying to access a particular device is authorized to do so. For example, in a display device such as a smart phone or a tablet personal computer (PC), a biometric information authentication method using a user's fingerprint is widely used. To provide a fingerprint sensing function, a fingerprint sensor may be embedded in the display device or attached to and/or under the display device. Such a fingerprint sensor integrated display device is called a fingerprint on display (FoD).

The FoD may include, for example, a light-sensing sensor. The FoD with the light-sensing sensor may use a light emitting element provided in a pixel as a light source and include an optical sensor array. The light emitting element may be used to illuminate the user's finger. The optical sensor array may be implemented with, for example, a CMOS image sensor (CIS), and may capture an image of the illuminated finger.

Detection capability of the input sensing device may deteriorate due to noise coming from the outside the input sensing device (e.g., fingerprint sensor). In other words, the sensitivity of the fingerprint sensor may be reduced by the noise.

SUMMARY

According to an exemplary embodiment of the present invention, there is provided an input sensing device including: a power line; driving lines; a first signal line including sub-lines; a second signal line connected to the sub-lines; and sensor pixels connected to the power line, the driving lines, and the first signal line, wherein at least one sensor pixel of the sensor pixels includes: an optical sensor that transfers a photoelectrically converted charge from the power line to a first node in response to a driving signal provided through a first driving line of the driving lines; a first transistor connected between the first node and a first sub-line among the sub-lines, wherein the first transistor includes a gate electrode connected to the first driving line; and a second transistor connected between the first node and a second sub-line among the sub-lines, wherein the second transistor includes a gate electrode connected to the first driving line.

The optical sensor may include: a photodiode connected between the power line and the first node; and a transmission transistor connected between the photodiode and the first node, wherein the transmission transistor includes a gate electrode connected to the first driving line.

The sub-lines may extend in a first direction and may be arranged along the first direction, the second signal line may be arranged parallel to the first signal line, and the driving lines may extend in a second direction crossing the first direction and be arranged along the first direction.

The second signal line may be connected to each of the first sub-line and the second sub-line.

A width of the second signal line may be greater than a width of the first signal line.

The input sensing device may further include: a first driver connected to the driving lines, wherein the first driver sequentially supplies the driving signal to the driving lines; and a second driver connected to the second signal line.

A sensor pixel farthest from the second driver among the sensor pixels may include an optical sensor and only one transistor directly connected to the first signal line.

A sensor pixel closest to the second driver among the sensor pixels may include an optical sensor and only one transistor directly connected to the first signal line.

According to an exemplary embodiment of the present invention, there is provided an input sensing device including: a power line; driving lines; a first signal line including a first sub-line, a second sub-line, and a third sub-line; a second signal line connected to the first signal line; and sensor pixel groups connected to the power line, the driving lines, and the first signal line, wherein at least one sensor pixel group among the sensor pixel groups includes: a first optical sensor for transferring a photoelectrically converted charge from the power line to the second sub-line in response to a driving signal provided through a first driving line among the driving lines; a second optical sensor for transferring a photoelectrically converted charge from the power line to the second sub-line in response to a driving signal provided through a second driving line among the driving lines; and a first transistor connected between the first sub-line and the second sub-line, wherein the first transistor includes a gate electrode connected to the first driving line.

The at least one sensor pixel group further includes: a second transistor connected between the third sub-line and the second sub-line, wherein the second transistor includes a gate electrode connected to the second driving line.

The first, second and third sub-lines may extend in a first direction and may be arranged along the first direction, the second signal line may be arranged parallel to the first signal line, and the driving lines may extend in a second direction crossing the first direction and be arranged along the first direction.

Each of the first and second optical sensors may include: a photodiode connected between the power line and the second sub-line; and a transmission transistor connected between the photodiode and the second sub-line, wherein the transmission transistor includes a gate electrode connected to a corresponding driving line among the driving lines.

The second signal line may be directly connected to each of the first sub-line and the third sub-line, and may not be directly connected to the second sub-line.

The optical sensors may further include a third optical sensor, each of the first, second and third optical sensors may include: a photodiode connected between the power line and the second sub-line; and a transmission transistor connected between the photodiode and the second sub-line, wherein the transmission transistor includes a gate electrode connected to a corresponding driving line among the driving lines.

The second driving line may be the same as the first driving line, and the second driving line may be different from a driving line connected to a gate electrode of a transmission transistor in each of the first, second and third optical sensors.

When a first driving signal having a gate-on voltage level is applied to the first driving line, a second driving signal having a gate-on voltage level may be sequentially provided to the first, second and third optical sensors.

According to an exemplary embodiment of the present invention, there is provided a display device including: a display panel including pixels for displaying an image; and an input sensing panel disposed on the display panel to sense light, wherein the input sensing panel includes: a power line; driving lines; a first signal line including sub-lines; a second signal line connected to the sub-lines; and sensor pixels connected to the power line, the driving lines, and the first signal line, wherein a first sensor pixel among the sensor pixels includes: a photodiode including a first electrode connected to the power line; a transmission transistor including a first electrode connected to a second electrode of the photodiode, and a gate electrode connected to a first driving line among the driving lines; and a first transistor including a first electrode connected to a first sub-line among the sub-lines, a second electrode connected to a second electrode of the transmission transistor, and a gate electrode connected to the first driving line, and wherein a second sensor pixel among the sensor pixels includes: a photodiode including a first electrode connected to the power line; a transmission transistor including a first electrode connected to a second electrode of the photodiode, and a gate electrode connected to a second driving line among the driving lines; and a second transistor including a first electrode connected to a second electrode of the transmission transistor, a second electrode connected to a third sub-line among the sub-lines, and a gate electrode connected to the second driving line.

The sub-lines may extend in a first direction and may be arranged along the first direction, the second signal line may be arranged parallel to the first signal line, and the driving lines may extend in a second direction crossing the first direction and may be arranged along the first direction.

A second electrode of the first transistor may be connected to the first electrode of the second transistor through a second sub-line among the sub-lines, and the second sub-line may be disposed between the first sub-line and the third sub-line.

The second signal line may be directly connected to each of the first sub-line and the third sub-line, and may not be directly connected to the second sub-line.

According to an exemplary embodiment of the present invention, there is provided an input sensing device including: a power line; a first driving line; a first signal line including a first sub-line and a second sub-line; a second signal line connected to the first sub-line and the second sub-line; an optical sensor connected between the power line and a first node; a first transistor connected between the first node and the first sub-line; and a second transistor connected between the first node and the second sub-line.

The first node may be directly connected to the first transistor and the second transistor.

A gate electrode of the first transistor may be connected to the first driving line and a gate electrode of the second transistor may be connected to the first driving line.

The first sub-line may be electrically connected to the second sub-line by the first transistor and the second transistor.

A width of the second signal line may be greater than a width of the first signal line.

DETAILED DESCRIPTION OF THE EMBODIMENTS

Figure 1A:
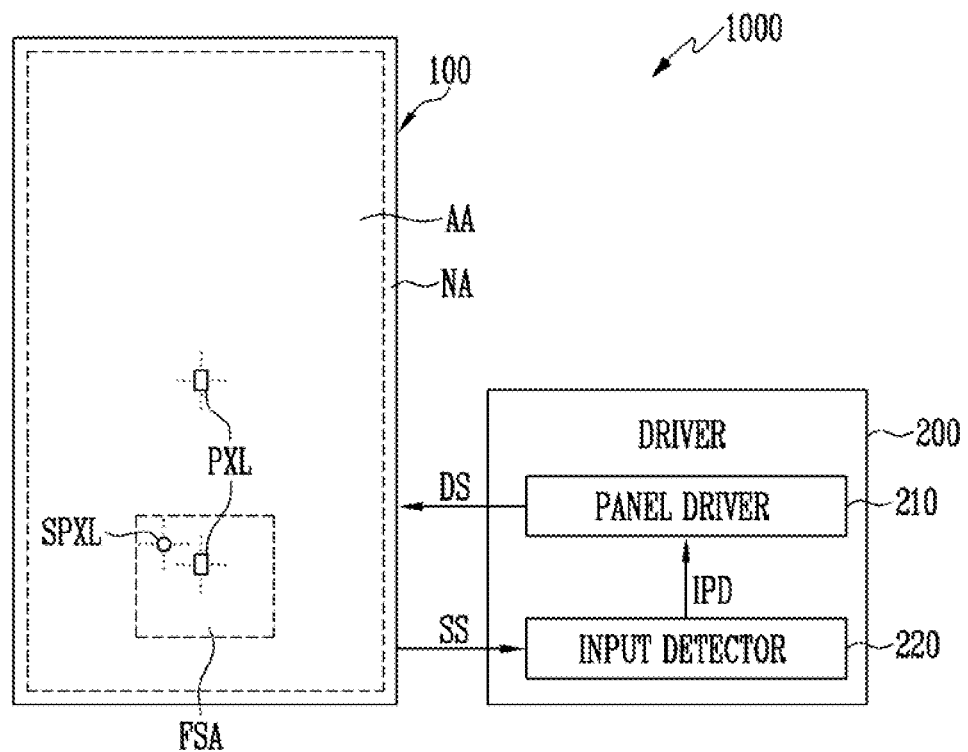
FIG. 1A is a block diagram showing a display device according to an exemplary embodiment of the present invention.

Hereinafter, exemplary embodiments of the present invention will be described in detail with reference to accompanying drawings. It is to be understood, however, that the described embodiments may be modified in many different ways, and thus, should not limited to the embodiments described herein.

Throughout the specification, like reference numerals can refer to like parts.

In addition, the size and thickness of elements in the accompanying drawings may be exaggerated for clarity of illustration.

Figure 1B:
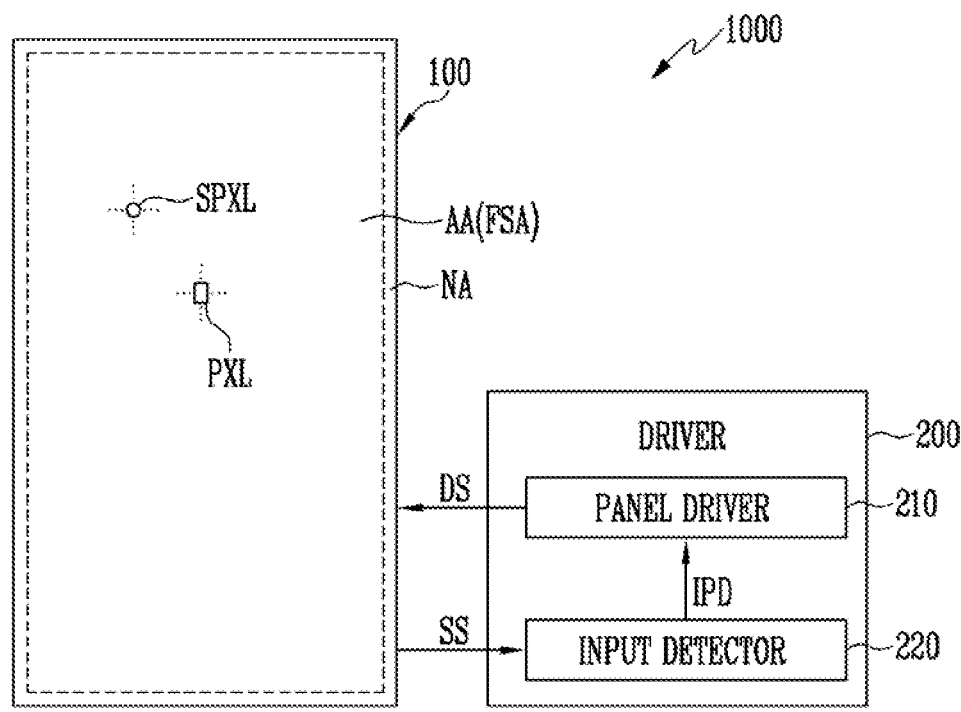
FIG. 1B is a block diagram showing another exemplary embodiment of the display device of FIG. 1A.

FIG. 1A is a block diagram showing a display device according to an exemplary embodiment of the present invention. FIG. 1B is a block diagram showing another exemplary embodiment of the display device of FIG. 1A. In FIGS. 1A and 1B, a display device is schematically shown.

Referring to FIGS. 1A and 1B, the display device 1000 may include a display panel 100 and a driver 200. For better understanding and ease of description, the display panel 100 and the driver 200 are separately shown in FIGS. 1A and 1B, but the present invention is not limited thereto. For example, all or a portion of the driver 200 may be integrally implemented on the display panel 100.

All or at least a portion of the display panel 100 may have flexibility.

The display panel 100 includes a display area AA and a non-display area NA. The non-display area NA may surround all or a portion of the display area AA. A pixel PXL (or a plurality of pixels) may be provided in the display area AA, and the display area AA may be referred to as an active area. The pixel PXL may include at least one light emitting element. The display device 1000 may drive the pixel PXL in response to image data input from the outside, and may display an image in the display area AA.

In an exemplary embodiment of the present invention, the display area AA may include an input sensing area FSA. At least some of the pixels PXL provided in the display area AA may be included in the input sensing area FSA.

In an exemplary embodiment of the present invention, as shown in FIG. 1A, at least a portion of the display area AA may be set as the input sensing area FSA.

FIG. 1A shows an exemplary embodiment in which only one input sensing area FSA is set in the display area AA, but the present invention is not limited thereto. For example, a plurality of input sensing areas FSA arranged regularly or irregularly may be set in the display area AA. Furthermore, the input sensing area FSA can be located anywhere in the display area AA.

For example, FIG. 1A shows an exemplary embodiment in which the input sensing area FSA is set in at least a portion of the display area AA, but the present invention is not limited thereto. For example, only at least a portion of the input sensing area FSA may overlap at least a portion of the display area AA.

In another exemplary embodiment of the present invention, as shown in FIG. 1B, the entire display area AA may be set as the input sensing area FSA. In this case, when performing an input sensing operation, the input sensing operation may be performed only in a portion of the display area AA that a user touches. Hereinafter, the input of a user may refer to a pattern or biometric information formed by a ridge of the user's skin, and may include for example, the user's fingerprint or palm pattern.

The non-display area NA may be disposed around the display area AA, and may be referred to as a non-active area. For example, the non-display area NA may include a line area, a pad area, and various dummy areas.

In an exemplary embodiment of the present invention, the display device 1000 may further include a sensor pixel SPXL (or a plurality of sensor pixels) in the input sensing area FSA. The sensor pixel SPXL may be composed of a sensor for sensing light. In an exemplary embodiment of the present invention, when light emitted from a light source (or pixel PXL) provided in the display device 1000 is reflected by the user's body (e.g., finger, palm, etc.), the sensor pixel SPXL may sense the reflected light and output a corresponding electrical signal (e.g., a voltage signal). The electrical signal may be transferred to the driver 200 (e.g., an input detector 220) and may be used for input sensing. Hereinafter, the present invention will be described with reference to an exemplary embodiment in which the sensor pixel SPXL is used for input sensing (e.g., fingerprint sensing). It is to be understood, however, that the sensor pixel SPXL may be used to perform various other functions such as functions of a touch sensor, a scanner, and the like.

When the sensor pixel SPXL is provided in the input sensing area FSA (or disposed on the input sensing area FSA), the sensor pixel SPXL may overlap the pixel PXL or be disposed around the pixel PXL. For example, some or all of the sensor pixels SPXL may overlap the pixel PXL, or the sensor pixel SPXL may be disposed between adjacent pixels PXL. The sensor pixel SPXL and the pixel PXL may have the same or different size. The relative size and arrangement between the sensor pixel SPLX and the pixel PXL is not particularly limited.

When the sensor pixel SPXL is disposed adjacent to the pixel PXL or overlaps at least a portion of the pixel PXL, the sensor pixel SPXL may use a light emitting element provided in the pixel PXL as a light source. In this case, the sensor pixel SPXL may be an input sensing sensor of a light sensing type together with a light emitting element provided in the pixel PXL. When an input sensing sensor embedded display device (e.g., a fingerprint sensor embedded display device) is configured using the pixel PXL as a light source without a separate external light source, a thickness of the input sensing sensor of the light sensing type and the display device including the same, may be reduced, and manufacturing cost thereof may be reduced.

In an exemplary embodiment of the present invention, the sensor pixel SPXL may be disposed on a different surface (e.g., a back surface) facing a surface (e.g., a front surface) on which an image is displayed among both sides of the display panel 100. However, the present invention is not limited to thereto.

The driver 200 can drive the display panel 100. For example, the driver 200 may output a data signal DS corresponding to image data to the display panel 100. In addition, the driver 200 may output a driving signal for the sensor pixel SPXL, and may receive an electrical signal (e.g., a sensing signal SS) from the sensor pixel SPXL. The driver 200 can detect the user's input (e.g., fingerprint, palm print, etc.) using an electrical signal.

In exemplary embodiments of the present invention, the driver 200 may include a panel driver 210 and an input detector 220. For better understanding and ease of description, the panel driver 210 and the input detector 220 are separately shown in FIGS. 1A and 1B, but the present invention is not limited thereto. For example, at least a portion of the input detector 220 may be integrated with the panel driver 210 or may operate in conjunction with the panel driver 210.

The panel driver 210 may supply a data signal DS corresponding to the image data to the pixel PXL while scanning the pixel PXL of the display area AA sequentially. In this case, the display panel 100 can display an image corresponding to the image data.

In an exemplary embodiment of the present invention, the panel driver 210 may supply a driving signal for fingerprint sensing to the pixel PXL. Here, the driving signal may be provided to the pixel PXL so that the pixel PXL emits light and operates as a light source for the sensor pixel SPXL. In the present embodiment, the driving signal for fingerprint sensing may be provided to a pixel PXL (e.g., a pixel PXL located in the input sensing area FSA) located in a specific area in the display panel 100.

In an exemplary embodiment of the present invention, the image data corresponding to the input sensing area FSA may be provided or controlled by the input detector 220. For example, when performing the input sensing operation, the input detector 220 may provide an image data corresponding to an image to be displayed in the input sensing area FSA.

In the alternative, when performing the input sensing operation, the input detector 220 may provide a control signal IPD to the panel driver 210.

In addition, a driving signal for fingerprint sensing may be provided to the sensor pixel SPXL by the input detector 220.

The input detector 220 may transfer a driving signal (e.g., a driving voltage) for driving the sensor pixel SPXL to the sensor pixel SPXL, and may detect the user's input based on an electrical signal received from the sensor pixel SPXL. For example, the input detector 220 may detect the user's fingerprint or palm print based on the sensing signal SS supplied from the sensor pixel SPXL (or a sensor array including the sensor pixel SPXL).

The input detector 220 and sensor pixel SPXL (or sensor array) may constitute an input sensing device.

Figure 2A:
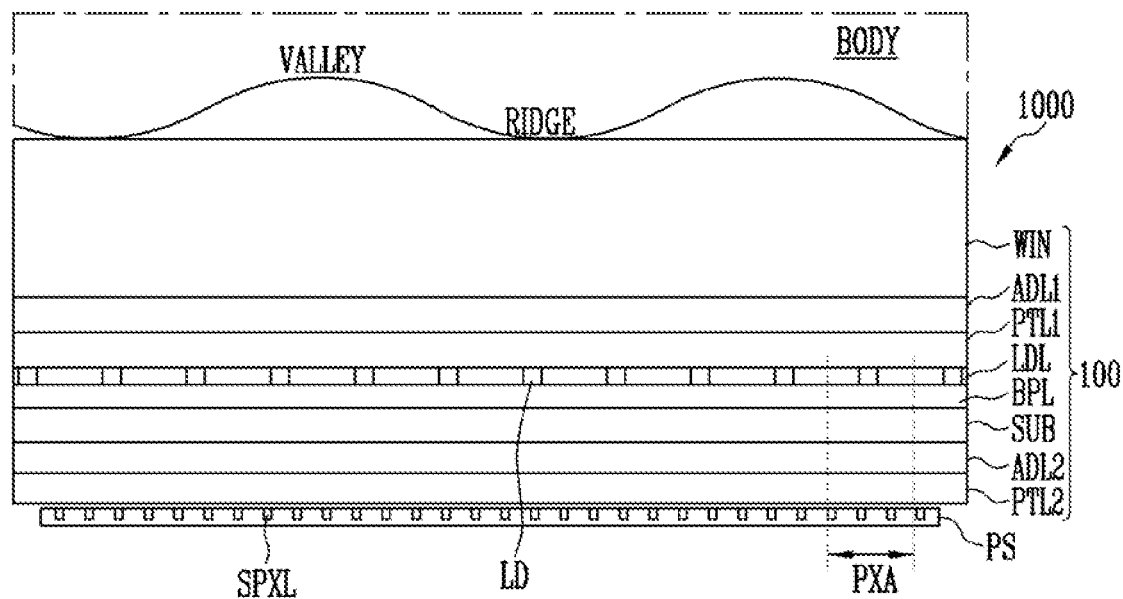
FIG. 2A is a cross-section view of the display device of FIG. 1A.

FIG. 2A is a cross-section view of the display device of FIG. 1A. A cross-section in the input sensing area FSA of the display device 1000 of FIGS. 1A and 1B is shown in FIG. 2A.

Referring to FIGS. 1A to 2A, the display device 1000 may include the display panel 100 and a sensor array PS (or an input sensing panel) disposed on one surface of the display panel 100 in the input sensing area FSA. In addition, the display device 1000 may include a substrate SUB, and a circuit element layer BPL, a light emitting element layer LDL, a first protective layer PTL1, a first adhesive layer ADL1, and a window WIN disposed sequentially on one surface (e.g., an upper surface) of the substrate SUB. In addition, the display device 1000 may include a second adhesive layer ADL2 and a second protective layer PTL2 sequentially disposed on the other surface (e.g., a lower surface) of the substrate SUB. In other words, the circuit element layer BPL, the light emitting element layer LDL, the first protective layer PTL1, the first adhesive layer ADL1, and the window WIN may be disposed on a first surface of the substrate SUB, and the second adhesive layer ADL2 and the second protective layer PTL2 may be disposed on a second surface of the substrate SUB. The first and second surfaces of the substrate SUB may face each other.

The substrate SUB may be a base substrate of the display panel 100, and may be a substantially transparent light-transmitting substrate. The substrate SUB may be a rigid substrate including glass or tempered glass, or a flexible substrate including a plastic material. However, the material of the substrate SUB is not limited to thereto, and the substrate SUB may be made of various materials.

The circuit element layer BPL may be disposed on one surface of the substrate SUB, and may include at least one conductive layer. For example, the circuit element layer BPL may include a plurality of circuit elements constituting a pixel circuit of the pixel PXL, and lines for supplying various power and signals for driving the pixel PXL. In this case, the circuit element layer BPL may include a plurality of conductive layers that constitute various circuit elements such as at least one transistor, a capacitor, and the like and lines connected thereto. In addition, the circuit element layer BPL may include at least one insulation layer provided between a plurality of conductive layers.

The light emitting element layer LDL may be disposed on one surface of the circuit element layer BPL. The light emitting element layer LDL may include a light emitting element LD (or a plurality of light emitting elements) connected to circuit elements and/or lines of the circuit element layer BPL through a contact hole or the like. A plurality of the light emitting elements LD may be spaced apart from each other on the surface of the circuit element layer BPL. In an exemplary embodiment of the present invention, at least one light emitting element LD may be provided in the pixel PXL (or pixel area PXA). For example, the light emitting element LD may be composed of an organic light emitting element, or an inorganic light emitting element such as a micro light emitting diode (LED) or a quantum dot light emitting diode (LED). In addition, the light emitting element LD may be a light emitting element made of an organic material and an inorganic material in combination.

The pixel PXL may include circuit elements disposed in the circuit element layer BPL and at least one light emitting element LD disposed in the light emitting element layer LDL on the circuit element layer BPL.

The first protective layer PTL1 may be disposed on the light emitting element layer LDL to cover the display area AA. The first protective layer PTL1 may include a sealing member such as a thin film encapsulation (TFE) or an encapsulation substrate, and may further include a protective film in addition to the sealing member.

The first adhesive layer ADL1 may be disposed between the first protective layer PTL1 and the window WIN to bond the first protective layer PTL1 and the window WIN. The first adhesive layer ADL1 may include a transparent adhesive such as an optically clear adhesive (OCA) or an optically clear resin (OCR), and may further include various adhesive materials.

The window WIN may be a protective member disposed on a top of a module of the display device 1000 including the display panel 100, and may be a substantially transparent light-transmitting substrate. The window WIN may have a multi-layer structure made up of a glass substrate, a plastic film, and/or a plastic substrate. The window WIN may include rigid or flexible materials, and the constituent material of the window WIN is not particularly limited thereto.

The display device 1000 may further include a polarizer, an anti-reflection layer, and/or a touch sensor layer. For example, the display device 1000 may further include a polarizer and/or a touch sensor layer disposed between the first protective layer PTL1 and the window WIN.

The second protective layer PTL2 may be disposed on the other surface of the substrate SUB. The second protective layer PTL2 may be bonded to the substrate SUB by the second adhesive layer ADL2.

The second adhesive layer ADL2 can firmly bond (or attach) the substrate SUB and the second protective layer PTL2. The second adhesive layer ADL2 may include a transparent adhesive such as an optically clear adhesive (OCA). The second adhesive layer ADL2 may include a pressure sensitive adhesive (PSA) in which an adhesive material acts when pressure is applied to an adhesive surface thereof.

The second protective layer PTL2 may block an inflow of oxygen and/or moisture from the outside, and may be provided in the form of a single layer or a multiple of layers. The second protective layer PTL2 may be formed of a film type to further secure flexibility of the display panel 100. The second protective layer PTL2 may be bonded with the sensor array PS through another adhesive layer, including a transparent adhesive such as the OCA.

A selective light blocking film may be further provided under the second protective layer PTL2. The selective light blocking film may block light (e.g., infrared light) of a specific frequency band among external light incident on the display device 1000 to prevent the light from being incident on the sensor pixel SPXL of the sensor array PS. The selective light blocking film may be provided under the second protective layer PTL2, but the present invention is not limited thereto.

The sensor array PS may be attached to the other surface (e.g., the back) of the display panel 100 through an adhesive or the like to overlap at least one area of the display panel 100. For example, the sensor array PS may overlap the display panel 100 in the input sensing area FSA. The sensor array PS may include the sensor pixels SPXL (or a plurality of sensor pixels) distributed with a predetermined resolution and/or interval. For example, a plurality of the sensor pixels SPXL may be spaced apart from each other in the sensor array PS.

In an exemplary embodiment of the present invention, an optical system that collects light directed to the sensor array PS and provides an optical path may be provided on the sensor array PS. A width of a light-transmitting part guiding light in the optical system may be determined in consideration of sensing precision and light conversion efficiency. A condensing rate of light incident to the sensor array PS by the optical system can be improved. The optical system may be formed of an optical fiber, silicon, or the like.

The sensor pixel SPXL may have a number, size and arrangement so that a fingerprint image can be obtained from an electrical signal output by the sensor pixel SPXL. The sensor pixel SPXL and another sensor pixel SPXL can be densely set so that light reflected from a sensing object (e.g., a fingerprint, etc.) can be incident on the adjacent sensor pixels SPXL.

The sensor pixel SPXL can sense external light to output an electrical signal, for example, a voltage signal corresponding thereto. The reflected light incident on the sensor pixel SPXL may have a light characteristic (e.g., a frequency, wavelength, size, etc.) due to a valley and a ridge formed in the user's body (e.g., finger). Therefore, the sensor pixel SPXL can output a sensing signal SS corresponding to the light characteristic of the reflected light.

The sensing signal SS output from the sensor pixel SPXL may be converted into image data by the input detector 220, and may be used for user identification (e.g., fingerprint authentication).

Figure 2B:
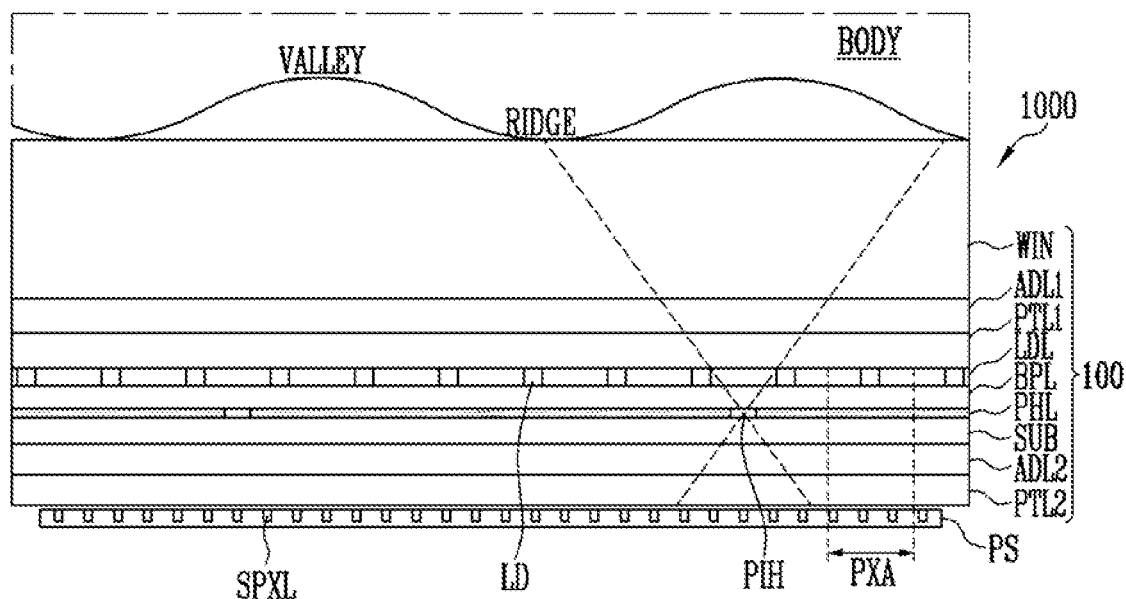
FIG. 2B is a cross-section view of the display device of FIG. 1A.

FIG. 2B is a cross-section view of the display device of FIG. 1A.

Referring to FIGS. 1A, 2A and 2B, the display device 1000 may further include a light blocking layer PHL including a pinhole PIH. The light blocking layer PHL may be disposed inside the display panel 100, or between the display panel 100 and the sensor pixel SPXL, and may block some of the light incident on the sensor pixel SPXL. For example, some of the light incident on the light blocking layer PHL may be blocked, while other light incident on the light blocking layer PHL may pass through a pinhole PIH to reach the sensor pixel SPXL under the light blocking layer PHL. For example, as shown in FIG. 2B, some of the light incident on the light blocking layer PHL may pass through the pinhole PIH to reach a plurality of sensor pixels SPXL. Other light incident on the light blocking layer PHL may be reflected back towards the window WIN.

The pinhole PIH may refer to an optical hole, and may be a type of light-transmitting hole. For example, the pinhole PIH may be a light-transmitting hole having the smallest size (or area) among light-transmitting holes formed by overlapping layers of the display device 1000 on each other along a path through which the reflected light passes through the display panel 100 in a diagonal or vertical direction and enters the sensor pixel SPXL.

The pinhole PIH may have a predetermined width, for example, a width of a range of 5 μm to 20 μm. Accordingly, as a distance from the light blocking layer PHL increases (e.g., as it goes upward and downward from the light blocking layer PHL), a width of an optical opening area in each layer of the display device 1000 may gradually increase.

The width (or diameter) of the pinhole PIH may be set to about 10 times or more of a wavelength of the reflected light, for example, about 4 μm or 5 μm or more to prevent diffraction of light. In addition, the width of the pinhole PIH may be set to a size sufficient to prevent an image blur and to more clearly sense a shape of the fingerprint. For example, the width of the pinhole PIH may be set to about 15 μm or less. However, the present invention is not limited to thereto, and the width of the pinhole PIH may change depending on a wavelength band of the reflected light, a thickness of each layer of the module, or the like.

Only a reflected light passing through the pinhole PIH can reach the sensor pixel SPXL of the sensor array PS. Due to the very narrow pinhole PIH, a phase of light reflected from the fingerprint and a phase of an image formed on the sensor array PS may have a difference of 180 degree.

The sensor pixel SPXL may output a sensing signal SS corresponding to the reflected light passing through the pinhole PIH, for example, a voltage signal.

However, this is an example, and a configuration, a disposition, and a driving method of the sensor array PS for detecting the reflected light from the fingerprint are not limited to the sensor array PS shown in FIG. 2A or 2B.

Figure 3:
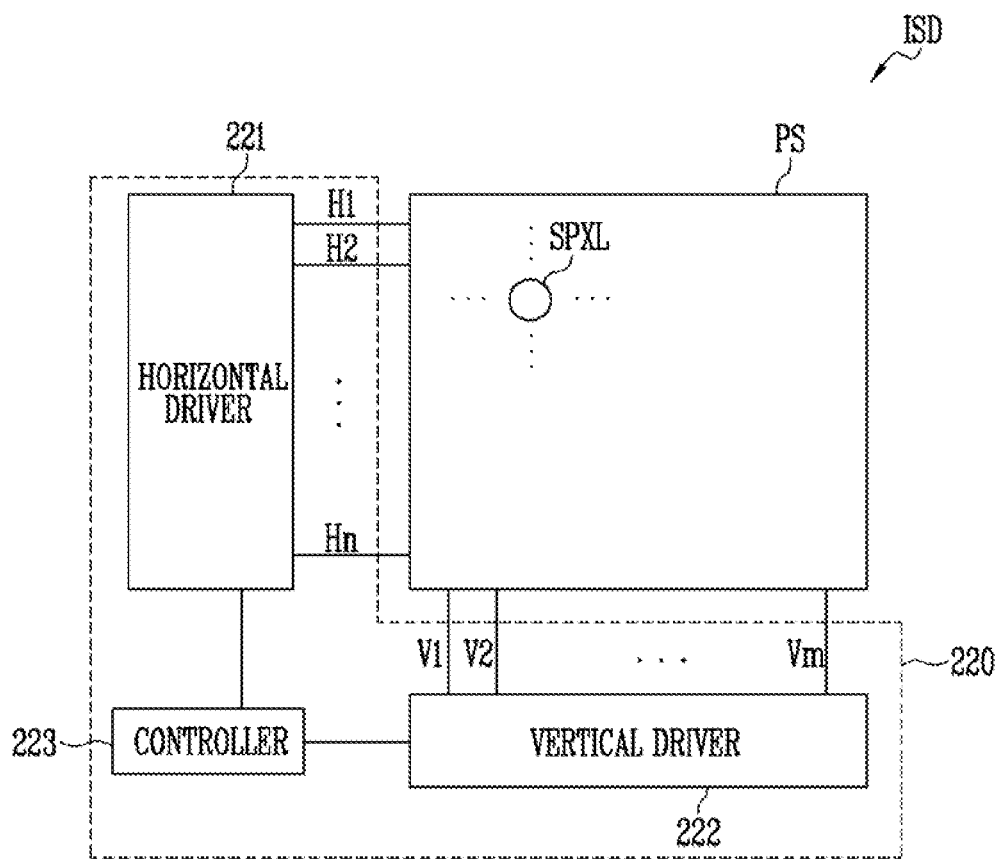
FIG. 3 is a block diagram showing an exemplary embodiment of an input sensing device included in the display device of FIG. 1A.

FIG. 3 is a block diagram showing an exemplary embodiment of an input sensing device included in the display device of FIG. 1A. The input sensing device ISD may include a sensor array PS and an input detector 220.

Referring to FIGS. 1A and 3, the sensor array PS (or input sensing panel) may include a sensor pixel SPXL. In an exemplary embodiment of the present invention, the sensor pixel SPXL may be arranged in a two-dimensional array, but is not limited thereto. The sensor pixel SPXL may include a photoelectric element that photoelectrically converts incident light into a charge depending on an amount of the light.

The input detector 220 may include a horizontal driver 221 (e.g., a first driver, or a scan driving circuit), a vertical driver 222 (e.g., a second driver, or a lead-out circuit), and a controller 223.

The horizontal driver 221 may be connected to the sensor pixel SPXL through driving lines H1 to Hn (here, n is an integer of two or more). The horizontal driver 221 may be composed of a shift register or an address decoder, and may sequentially apply a driving signal (or driving signals) to the driving lines H1 to Hn. Here, the driving signal may be a signal for selectively driving the sensor pixel SPXL. For example, the horizontal driver 221 may apply a driving signal in units of sensor pixel rows. For example, the driving signal may be provided to the sensor pixel row connected to the first driving line H1.

The sensor pixel SPXL selected and driven by the horizontal driver 221 may sense light using a photoelectric element therein, and may output an electrical signal (e.g., a sensing signal SS) corresponding to sensed light, for example, a voltage signal. The electrical signal may be an analog signal. In other words, the sensing signal SS may be an analog signal.

The vertical driver 222 may be connected to output lines V1 to Vm (here, m is an integer of two or more), and may be connected to the sensor pixel SPXL through the output lines V1 to Vm. The vertical driver 222 may process signals output from the sensor pixel SPXL.

For example, the vertical driver 222 may perform a correlated double sampling (CDS) process for removing noise from an electrical signal provided from the sensor pixel SPXL. In addition, the vertical driver 222 may convert an electrical signal of an analog type into a signal of a digital type. In an exemplary embodiment of the present invention, an analog-digital converter may be provided for each sensor pixel column, and may process electrical signals (or analog signals) provided from the sensor pixel column in parallel.

The controller 223 may control the horizontal driver 221 and the vertical driver 222.

For example, the controller 223 may provide a first driving voltage (e.g., a gate-off voltage), a second driving voltage (e.g., a gate-on voltage), a common voltage, a clock signal, and a control signal (e.g., a start pulse) to the horizontal driver 221. In this case, the horizontal driver 221 may generate a driving signal to selectively drive the sensor pixel SPXL based on signals provided from the controller 223.

For example, the controller 223 may provide the clock signal and the control signal to the vertical driver 222. In this case, the vertical driver 222 may periodically sample the sensing signal SS provided from the sensor pixel SPXL based on the clock signal and the control signal, and may convert the sampled signal into a signal of a digital type.

In an exemplary embodiment of the present invention, the controller 223 may generate image data corresponding to the sensing signal SS received from the vertical driver 222, and may process the generated image data. In addition, the controller 223 may detect an input (e.g., a fingerprint, palm print, etc.) from the processed image data, and may authenticate the detected input or transfer the processed image data to the outside.

However, this is merely an example, and the generation of image data and input detection may be not performed by the controller 223. For example, image data generation and input detection may be performed by an external host processor or the like.

The horizontal driver 221, the vertical driver 222, and the controller 223 are shown to be independently formed in FIG. 3, but the present invention is not limited thereto. For example, the vertical driver 222 and the controller 223 may be implemented as one integrated circuit, and the horizontal driver 221 may be formed on the sensor array PS through the same process as the sensor pixel SPXL.

Figure 4:
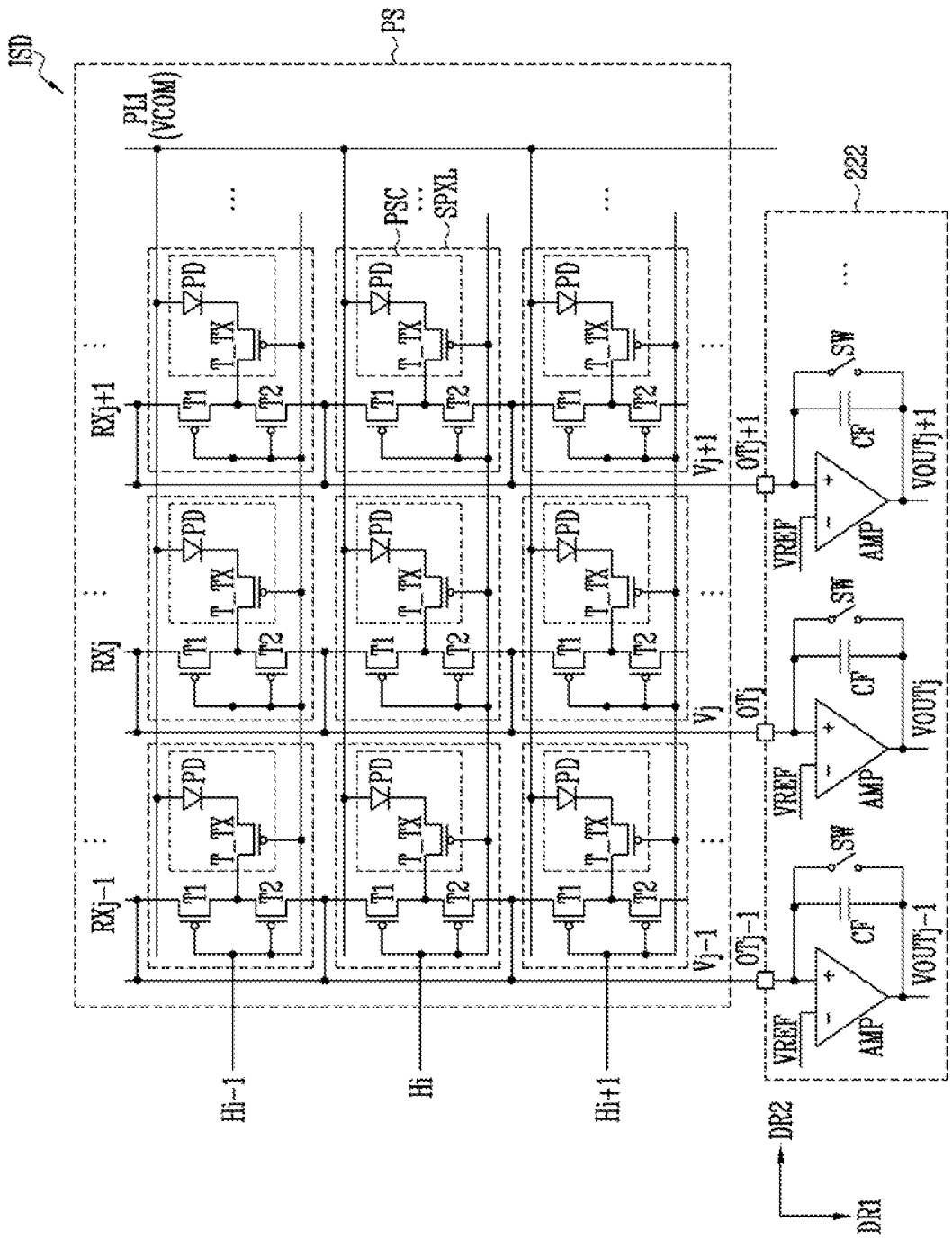
FIG. 4 is a circuit diagram showing an exemplary embodiment of the input sensing device of FIG. 3.
Figure 5:
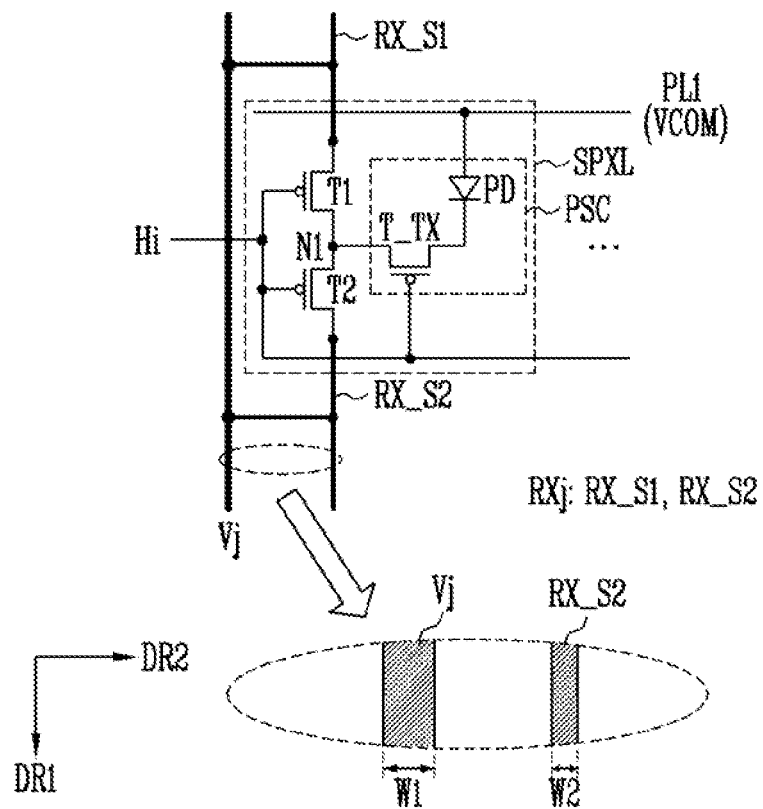
FIG. 5 is a drawing showing an exemplary embodiment of a sensor pixel included in the input sensing device of FIG. 4.

FIG. 4 is a circuit diagram showing an exemplary embodiment of the input sensing device ISD of FIG. 3. In FIG. 4, the input sensing device ISD is briefly shown focused on a sensor pixel SPXL included in i−1-th to i+1-th sensor pixel rows (here i is a positive integer less than n) and j−1-th to j+1-th sensor pixel columns (here j is a positive integer less than m), and the vertical driver 222 (or integral circuits) connected thereto. FIG. 5 is a drawing showing an exemplary embodiment of a sensor pixel SPXL included in the input sensing device ISD of FIG. 4. FIG. 5 shows the sensor pixel SPXL included in the i-th sensor pixel row and the j-th sensor pixel column.

Referring to FIGS. 3 to 5, the input sensing device ISD (or sensor array PS) may include driving lines Hi−1, Hi, and Hi+1, output lines Vj−1, Vj, and Vj+1 (or second signal lines), signal lines RXj−1, RXj, and RXj+1 (or first signal lines), a power line PL1, and sensor pixels SPXL connected thereto.

The driving lines Hi−1, Hi, and Hi+1 may extend in a second direction DR2, and may be arranged in a first direction DR1 crossing the second direction DR2.

The output lines Vj−1, Vj, and Vj+1 may extend in the first direction DR1, and may be arranged in the second direction DR2.

The signal lines RXj−1, RXj, and RXj+1 may extend in the first direction DR1, and may be arranged in the second direction DR2. The signal lines RXj−1, RXj, and RXj+1 may extend parallel to the output lines Vj−1, Vj, and Vj+1, and the signal lines RXj−1, RXj, and RXj+1 and the output lines Vj−1, Vj, and Vj+1 may be alternately arranged in the second direction DR2.

In exemplary embodiments of the present invention, each of the signal lines RXj−1, RXj, and RXj+1 may include a plurality of sub-lines. As shown in FIG. 5, the j-th signal line RXj may include a first sub-line RX_S1 and a second sub-line RX_S2. The first sub-line RX_S1 and the second sub-line RX_S2 may extend in the first direction DR1, and may be arranged in the first direction DR1. The first sub-line RX_S1 may be separated from the second sub-line RX_S2. For example, a pair of transistors may be disposed between the first sub-line RX_S1 and the second sub-line RX_S2.

The power line PL1 may be arranged in a matrix form, and a common voltage VCOM (e.g., a ground voltage) may be applied to the power line PL1.

The sensor pixels SPXL may be connected to the driving lines Hi−1, Hi, and Hi+1, the output lines Vj−1, Vj, and Vj+1 (or second signal lines), the signal lines RXj−1, RXj, and RXj+1 (or first signal lines), and the power line PL1.

Since the sensor pixels SPXL are substantially equivalent to each other, the sensor pixel SPXL included in the i-th sensor pixel row and j-th sensor pixel column will be described as representative of the sensor pixels SPXL.

Referring to FIG. 5, the sensor pixel SPXL may include an optical sensor PSC, a first transistor T1, and a second transistor T2.

The optical sensor PSC may be connected to the power line PL1, the i-th driving line Hi, and a first node N1, and may transfer a photoelectrically converted charge (or sensing signal SS, see FIG. 1A) to the first node N1 in response to a driving signal provided through the i-th driving line Hi.

In an exemplary embodiment of the present invention, the optical sensor PSC may include a photodiode PD and a transmission transistor T_TX.

The photodiode PD may be electrically connected between the power line PL1 and the first node N1, and may generate a charge (or a current) based on the incident light. In other words, the photodiode PD can perform a function of photoelectric conversion. For example, an anode of the photodiode PD may be connected to the power line PL1, and a cathode of the photodiode PD may be electrically connected to the first node N1. In other words, a first terminal of the photodiode PD may be connected to the power line PL1, and a second terminal of the photodiode PD may be electrically connected to the first node N1.

The transmission transistor T_TX may include a first electrode (or first transistor electrode) connected to the cathode of the photodiode PD, a second electrode (or second transistor electrode) electrically connected to the first node N1, and a gate electrode connected to the i-th driving line Hi.

In other words, the transmission transistor T_TX may be electrically connected between the cathode of the photodiode PD and the first node N1. In this case, the transmission transistor T_TX may be turned on in response to a driving signal (e.g., a driving signal at a gate-on voltage level that turns on a transistor) provided through the i-th driving line Hi, and may transfer the photoelectrically converted charge from the photodiode PD to the first node N1.

In FIG. 5, the optical sensor PSC is shown to include the photodiode PD and the transmission transistor T_TX, but the optical sensor PSC is not limited thereto. For example, the optical sensor PSC may further include a transistor for initializing the photodiode PD, a capacitor for temporarily storing a charge of the photodiode PD, and a transistor for transferring a predetermined signal (e.g., a current), instead of the charge of the photodiode PD, to the first node N1 in response to the charge of the photodiode PD.

The first transistor T1 may include a first electrode connected to the first sub-line RX_S1, a second electrode connected to the first node N1, and a gate electrode connected to the i-th driving line Hi. In other words, the first transistor T1 may be connected between the first sub-line RX_S1 and the first node N1. In this case, the first transistor T1 may be turned on in response to a driving signal (e.g., a driving signal at a gate-on voltage level) provided through the i-th driving line Hi, and may electrically connect the first node N1 and the first sub-line RX_S1.

The second transistor T2 may include a first electrode connected to the first node N1, a second electrode connected to the second sub-line RX_S2, and a gate electrode connected to the i-th driving line Hi. In other words, the second transistor T2 may be connected between the second sub-line RX_S2 and the first node N1. In this case, the second transistor T2 may be turned on in response to a driving signal (e.g., a driving signal at the gate-on voltage level) provided through the i-th driving line Hi, and may electrically connect the first node N1 and the second sub-line RX_S2. When the first and second transistors T1 and T2 are turned on, the first and second sub-lines RX_S1 and RX_S2 may be electrically connected to each other.

The j-th output line Vj may be connected to each of the first sub-line RX_S1 and the second sub-line RX_S2. In this case, the first electrode of the first transistor T1 may be electrically connected to the j-th output line Vj through the first sub-line RX_S1, and the second electrode of the second transistor T2 may be electrically connected to the j-th output line Vj through the second sub-line RX_S2. Here, the first transistor T1 and the second transistor T2 may form a current path between the first node N1 and the j-th output line Vj in response to a driving signal provided through the i-th driving line Hi.

When a driving signal is not applied to the i-th driving line Hi (or when a driving signal at a gate-off voltage level that turns off a transistor is applied to the i-th driving line Hi), the first transistor T1 and the second transistor T2 may maintain a turn-off state, and may electrically separate the optical sensor PSC from the j-th signal line RXj (e.g., first sub-line RX_S1 and second sub-line RX_S2). In addition, since the driving signal is not applied to the i-th driving line Hi, the first sub-line RX_S1 and the second sub-line RX_S2 may be electrically separated from each other, and the possibility that noise flows through the j-th signal line RXj and a size of the noise may be reduced. For example, since the first sub-line RX_S1 and the second sub-line RX_S2 are electrically separated, the length of the wiring for the j-th signal line RXj is decreased, thereby reducing the amount of noise.

In addition, the first transistor T1 and the second transistor T2 may block a leakage current flowing through the transmission transistor T_TX, and may block noise caused by a leakage current of the sensor pixel SPXL that is not selected.

In other words, the first transistor T1 and the second transistor T2 can constitute a noise prevention circuit for each sensor pixel SPXL.

In exemplary embodiments of the present invention, a load (or a resistance value) of the j-th output line Vj may be smaller than a load of the j-th signal line RXj. For example, a first line width W1 of the j-th output line Vj may be greater than a second line width W2 of the j-th signal line RXj (e.g., second sub-line RX_S2). The noise may be blocked through the j-th signal line RXj with a relatively large load, and a charge (e.g., a sensing signal with reduced noise) may be directly provided to the vertical driver 222 through the j-th output line Vj with a relatively small load. In an alternative embodiment, the first line width W1 and the second line width W2 may be the same as each other or the second line width W2 may be greater than the first line width W1.

In FIG. 5, the transmission and first and second transistors T_TX, T1, and T2 are shown to P-type transistors, but at least some of the transmission and first and second transistors T_TX, T1, and T2 may be N-type transistors, so that a circuit structure of the sensor pixel SPXL may be variously modified.

Referring back to FIG. 4, the vertical driver 222 may include integral circuits.

The integral circuits may be connected to the output lines Vj−1, Vj, and Vj+1 through input terminals OTj−1, OTj, and OTj+1, respectively, and may generate output signals VOUTj−1, VOUTj, and VOUTj+1, respectively. Since the integral circuits are substantially equivalent to each other, an integral circuit connected to the j-th output line Vj will be described as representative of the integral circuits.

The integral circuit (or vertical driver 222) may include an amplifier AMP, a capacitor CF, and a switch SW. A first input terminal (e.g., an input terminal of a positive polarity (+)) of the amplifier AMP may be connected to the j-th output line Vj through the j-th input terminal OTj, and a reference voltage VREF may be applied to a second input terminal (e.g., an input terminal of a negative polarity (−)) of the amplifier AMP.

The capacitor CF may be connected between the first input terminal and output terminal of the amplifier AMP, and the switch SW may be connected in parallel to the capacitor CF.

When the switch SW is turned off, the capacitor CF may integrate the charge (e.g., a sensing signal) provided to the first input terminal of the amplifier AMP, and the amplifier AMP may output a sensing signal integrated through the output terminal, in other words, the j-th output signal VOUTj.

When the switch SW is turned on, the capacitor CF may be initialized.

As described with reference to FIGS. 4 and 5, the sensor pixel SPXL includes the first and second transistors T1 and T2 connected between sub-lines RX_S1 and RX_S2 of the j-th signal line RXj, and may reduce or block both noise flowing through the j-th signal line RXj and noise (or leakage current) flowing from the optical sensor PSC by using the first and second transistors T1 and T2. Therefore, sensing sensitivity of the input sensing device ISD can be increased.

According to an exemplary embodiment of the present invention, as shown in FIGS. 4 and 5, the input sensing device ISD includes a power line PL1; a driving line Hi; a first signal line RXj including sub-lines RX_S1 and RX_S2; a second signal line Vj connected to the sub-lines RX_S1 and RX_S2; and sensor pixels SPXL connected to the power line PL1, the driving line Hi, and the second signal line Vj, wherein at least one sensor pixel SPXL includes: an optical sensor PSC that transfers a photoelectrically converted charge from the power line PL1 to a first node N1 in response to a driving signal provided through an i-th driving line Hi of the driving lines Hi−1, Hi, and Hi+1; a first transistor T1 connected between the first node N1 and a first sub-line RX_S1 among the sub-lines, wherein the first transistor T1 includes a gate electrode connected to the i-th driving line Hi; and a second transistor T2 connected between the first node N1 and a second sub-line RX_S2 among the sub-lines, wherein the second transistor T2 includes a gate electrode connected to the i-th driving line Hi.

Figure 6:
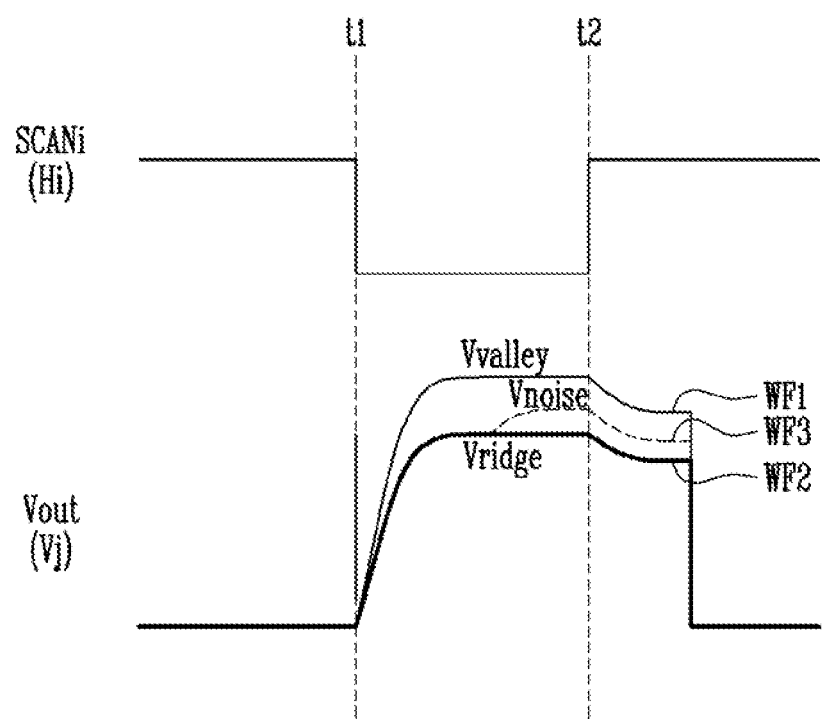
FIG. 6 is a waveform diagram describing an operation of the sensor pixel of FIG. 5, according to an exemplary embodiment of the present invention.

FIG. 6 is a waveform diagram describing an operation of the sensor pixel of FIG. 5, according to an exemplary embodiment of the present invention.

Referring to FIGS. 4 to 6, the i-th driving signal SCANi may be provided to the i-th driving line Hi, and the output signal Vout may correspond to the j-th output line Vj. In other words, the output signal Vout may be a j-th output signal VOUTJ output through an integral circuit connected to the j-th output line Vj.

At a first time point t1, the i-th driving signal SCANi may be changed from a logic high level (or a gate-off voltage level) to a logic low level (or a gate-on voltage level). At a second time point t2, the i-th driving signal SCANi may be changed from the logic low level to the logic high level.

In this case, the transmission transistor T_TX, the first transistor T1, and the second transistor T2 of the sensor pixel SPXL may be turned on, and the charge (or current) generated by the photodiode PD may be transferred to the j-th output line Vj through the transmission transistor T_TX, the first node N1, the first transistor T1, the second transistor T2, and the j-th signal line RXj (or first sub-line RX_S1 and second sub-line RX_S2).

The integral circuit described with reference to FIG. 4 may integrate the charge provided through the j-th output line Vj, and accordingly, a voltage level of the output signal Vout may be gradually increased and be saturated at a specific voltage level.

When a reflected light corresponding to the valley is incident on the sensor pixel SPXL, the output signal Vout may change along a first curve WF1, and may have a first voltage level Vvalley. Alternatively, when a reflected light corresponding to the ridge is incident on the sensor pixel SPXL, the output signal Vout may change along a second curve WF2, and may have a second voltage level Vridge. The second voltage level Vridge may be lower than the first voltage level Vvalley.

On the other hand, when noise flows into the input sensing device ISD (or sensor array PS), the output signal Vout corresponding to the ridge may change along a third curve WF3 different from the second curve WF2, and may have a third voltage level Vnoise. In this case, a signal to noise ratio may decrease (e.g., a value of "(Vvalley−Vridge)/Vnoise" may decrease), and the ridge may not be sensed property. For example, the difference between the first voltage level Vvalley and the second voltage level Vridge may lessen due to the noise, thereby preventing the ridge from being correctly sensed.

Therefore, the sensor pixel SPXL may reduce noise by using the first and second transistors T1 and T2 connected between the first and second sub-lines RX_S1 and RX_S2 of the signal lines RXj−1, RXj, and RXj+1, and thus the sensing sensitivity (or a signal to noise ratio) of the input sensing device ISD may be improved.

Figure 7:
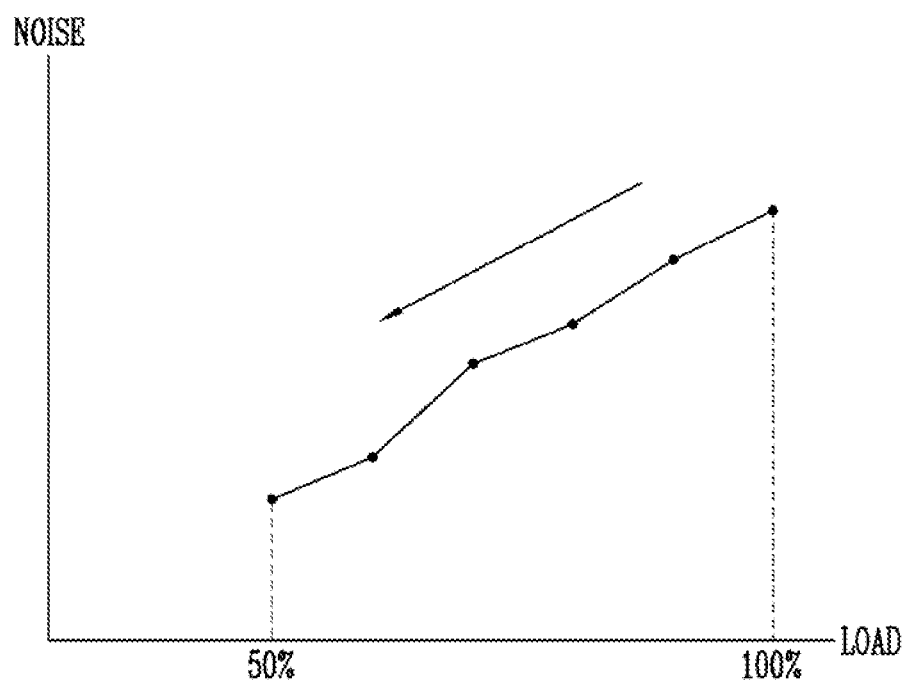
FIG. 7 is a drawing describing a change in noise caused by the sensor pixels in FIG. 5.

FIG. 7 is a drawing describing a change in noise caused by the sensor pixels in FIG. 5.

Referring to FIGS. 4, 5 and 7, when the sensor pixel SPXL does not include the first and second transistors T1 and T2, a load LOAD of the j-th signal line RXj may be expressed as 100%. For example, a level of noise NOISE flowing through the j-th signal line RXj having the load LOAD of 100% may be about 8.5 mV.

The sensor pixel SPXL may be electrically blocked by at least one of first and second transistors T1 and T2 in the first direction DR1 of the j-th signal line RXj, and thus, the level of the noise NOISE flowing through the j-th signal line RXj may be reduced. For example, the sensor pixel SPXL may be electrically blocked by the first transistor T1 or the second transistor T2 or by both of the first and second transistors T1 and T2 at the same time.

As described with reference to FIGS. 4 and 5, when each sensor pixel SPXL includes first and second transistors T1 and T2 and the j-th output line Vj, the load LOAD of the j-th signal line RXj may be reduced to about 50% or less, and in this case, the level of noise NOISE flowing through the j-th signal line RXj may be reduced. For example, the level of the noise NOISE may be reduced to about 5 mV or less.

Figure 8:
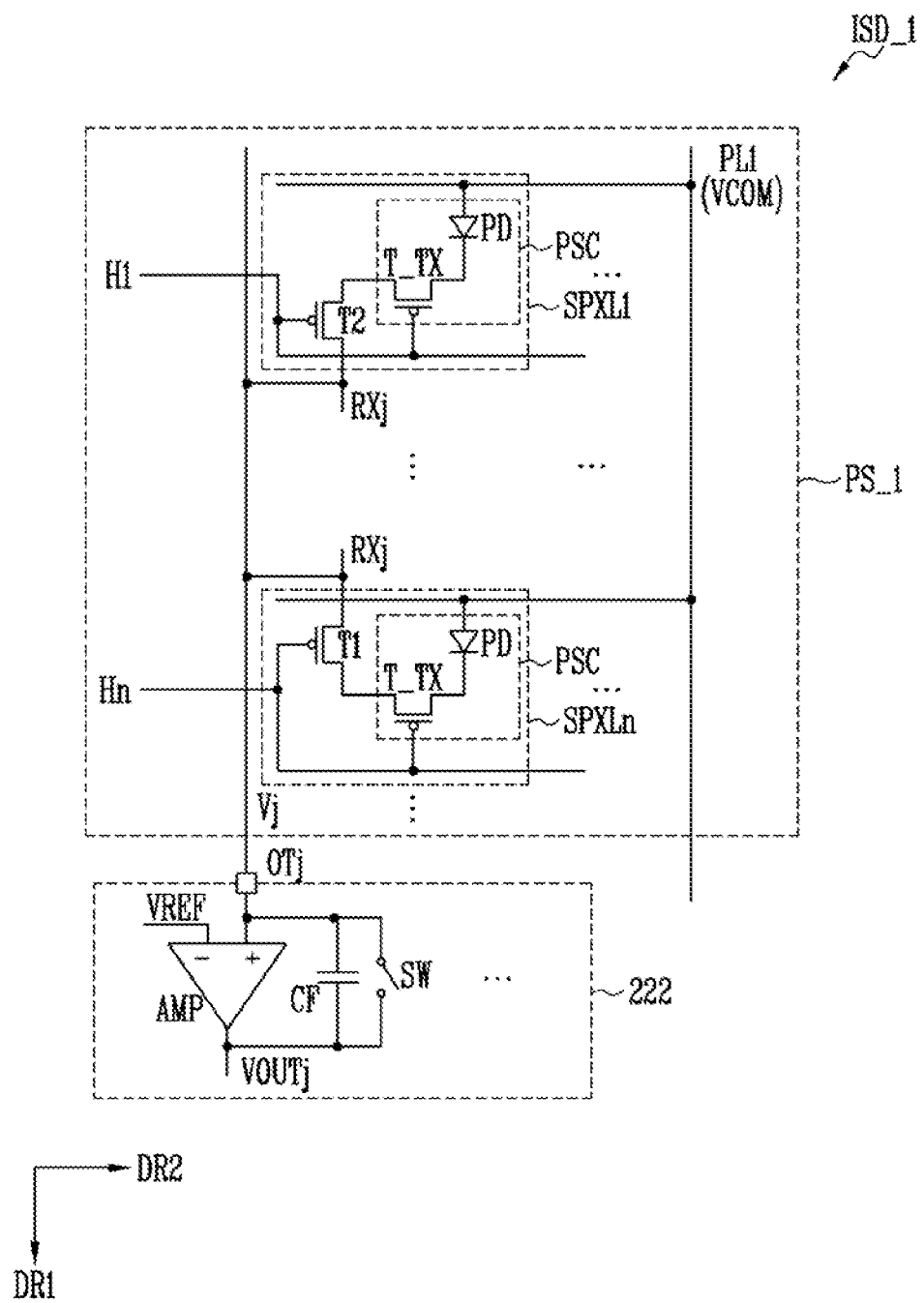
FIG. 8 is a circuit diagram showing another exemplary embodiment of the input sensing device of FIG. 3.

FIG. 8 is a circuit diagram showing another exemplary embodiment of the input sensing device of FIG. 3.

Referring to FIGS. 3, 4, 5 and 8, the input sensing device ISD_1 (or sensor array PSI1) of FIG. 8 is different from the input sensing device ISD (or sensor array PS) of FIG. 4 in that at least one sensor pixel SPXL includes only one of the first and second transistors T1 and T2.

As shown in FIG. 8, a first sensor pixel SPXL1 connected to the j-th output line Vj and farthest from the vertical driver 222, may include the second transistor T2 described with reference to FIG. 5 and may not include the first transistor T1.

In addition, an n-th sensor pixel SPXLn connected to the j-th output line Vj and closest to the vertical driver 222, may include the first transistor T1 described with reference to FIG. 5 and may not include the second transistor T2.

Any sensor pixel connected to the j-th output line Vj and disposed between the first sensor pixel SPXL1 and the n-th sensor pixel SPXLn may include both first and second transistors T1 and T2 as described with reference to FIGS. 4 and 5. In addition, any sensor pixel connected to the j-th output line Vj and disposed between the first sensor pixel SPXL1 and the n-th sensor pixel SPXLn may include just one of the first and second transistors T1 and T2 as described with reference to FIGS. 4 and 5.

As described with reference to FIG. 8, the input sensing device ISD_1 may include at least one sensor pixel (e.g., a first sensor pixel SPXL1 and/or an n-th sensor pixel SPXLn) having a pixel structure different from the sensor pixel SPXL described with reference to FIGS. 4 and 5.

Figure 9A:
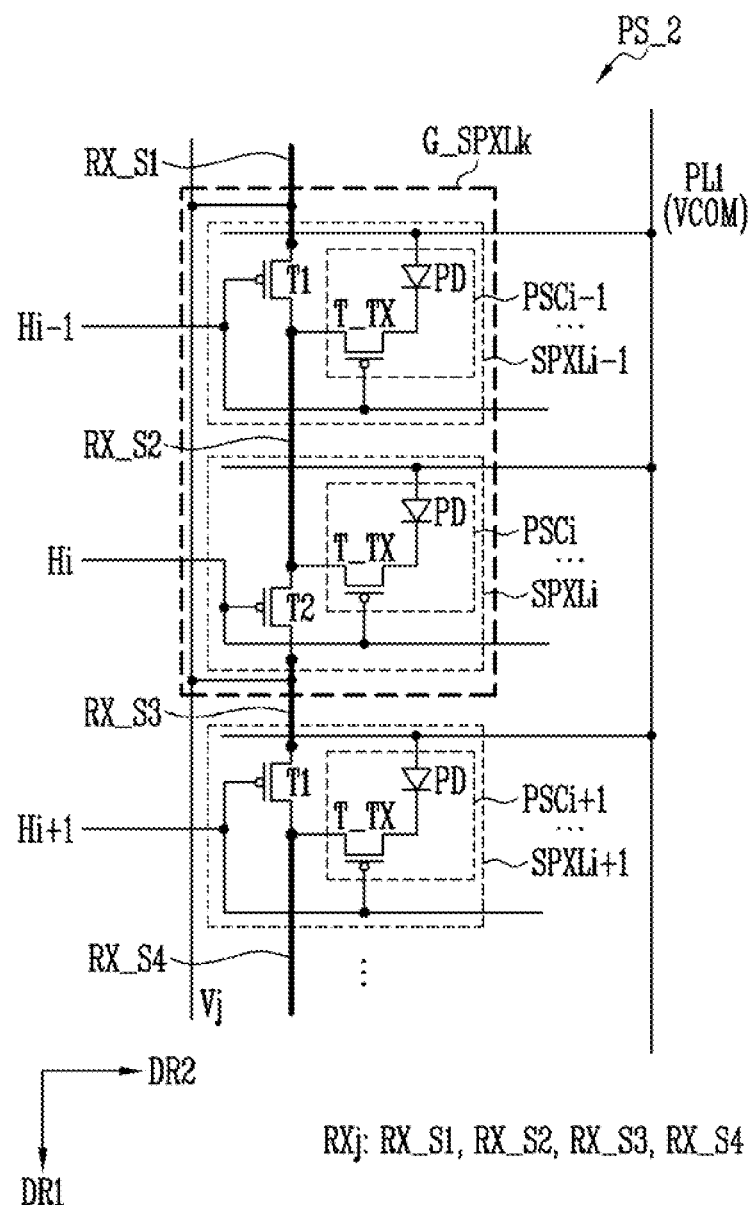
FIGS. 9A and 9B are circuit diagrams showing an exemplary embodiment of a sensor array included in the input sensing device of FIG. 3.
Figure 9B:
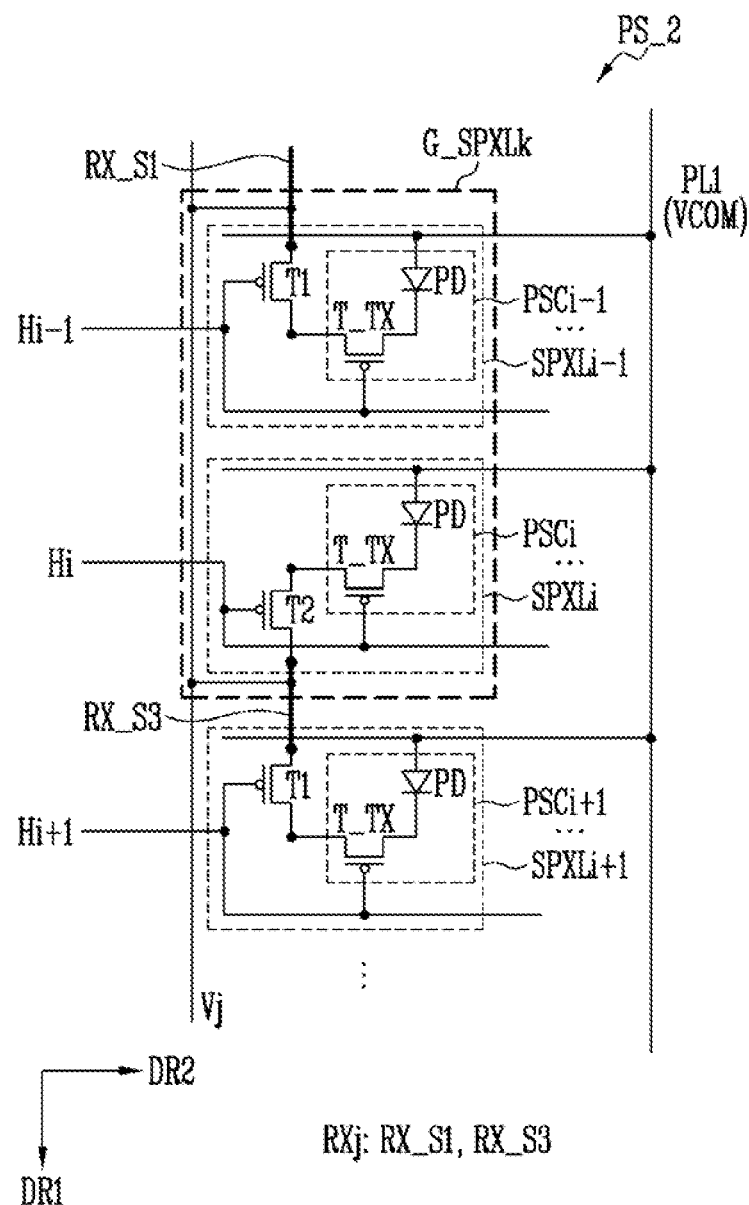

FIGS. 9A and 9B are circuit diagrams showing an exemplary embodiment of a sensor array included in the input sensing device of FIG. 3. In FIGS. 9A and 9B, sensor pixels SPXLi−1, SPXLi, and SPXLi+1 included in the i−1-th to i+1-th sensor pixel rows and the j-th sensor pixel column are shown.

Referring to FIGS. 3, 4, 9A and 9B, a sensor array PS_-2 shown in FIGS. 9A and 9B is different from the sensor array PS shown in FIG. 4 in that the sensor pixels SPXLi−1, SPXLi, and SPXLi+1 include the first transistor T1 or the second transistor T2. For example, in FIG. 9A, each of the sensor pixels SPXLi−1, SPXLi, and SPXLi+1 includes just one transistor for controlling the connection between sub-lines RX_S1, RX_S2, RX_S3, and RX_S4 of the j-th signal line RXj.

The sensor array PS_2 may include a k-th sensor pixel group G_SPXLk (here k is a positive integer less than n), and the k-th sensor pixel group G_SPXLk may include sensor pixels SPXLi−1 and SPXLi, and a pair of first and second transistors T1 and T2 included therein.

As shown in FIG. 9A, the k-th sensor pixel group G_SPXLk may include the i−1-th sensor pixel SPXLi−1 and the i-th sensor pixel SPXLi, in other words, two sensor pixels.

The i−1-th sensor pixel SPXLi−1 (or an odd numbered sensor pixel) may include the i−1-th optical sensor PSCi−1 and the first transistor T1, and may not include the second transistor T2.

The i−1-th optical sensor PSCi−1 may be connected to the power line PL1, the i−1-th driving line Hi−1, and the second sub-line RX_S2. Since the i−1-th optical sensor PSCi−1 is substantially equivalent to the optical sensor PSC described with reference to FIG. 5 except that it is connected to the second sub-line RX_S2 instead of the first node N1, redundant descriptions will not be repeated. The first sub-line RX_S1, the second sub-line RX_S2, the third sub-line RX_S3, and the fourth sub-line RX_S4 may be included in the j-th signal line RXj.

The first transistor T1 of the i−1-th sensor pixel SPXLi−1 may include a first electrode connected to the first sub-line RX_S1, a second electrode connected to the second sub-line RX_S2 (or a second electrode of the transmission transistor T_TX in the i−1-th optical sensor PSCi−1), and a gate electrode connected to the i−1-th driving line Hi−1.

The i-th sensor pixel SPXLi (or an even numbered sensor pixel) may include the i-th optical sensor PSCi and the second transistor T2, and may not include the first transistor T1.

The i-th optical sensor PSCi may be connected to the power line PL1, the i-th driving line Hi, and the second sub-line RX_S2. The i-th optical sensor PSCi may be substantially equivalent to the i−1-th optical sensor PSCi−1. The i-th optical sensor PSCi (or the i-th sensor pixel SPXLi) and the i−1-th optical sensor PSCi−1 (or the i−1-th sensor pixel SPXLi−1) may be directly connected to each other through the second sub-line RX_S2. In this case, a separate transistor for connecting or disconnecting the i-th optical sensor PSCi and the i−1-th optical sensor PSCi−1 may not be disposed between the i-th optical sensor PSCi and the i−1-th optical sensor PSCi−1.

The second transistor T2 of the i-th sensor pixel SPXLi may include a first electrode connected to the second sub-line RX_S2 (or second electrode of the transmission transistor T_TX in the i-th optical sensor PSCi), a second electrode connected to the third sub-line RX_S3, and a gate electrode connected to the i-th driving line Hi.

The j-th output line Vj may be connected to the first sub-line RX_S1 and the third sub-line RX_S3, and may be not directly connected to the second sub-line RX_S2 and the fourth sub-line RX_S4.

In other words, the first transistor T1 and the second transistor T2 for performing the noise prevention function for the j-th signal line RXj may be provided for each sensor pixel group (e.g., each sensor pixel group including two sensor pixels) instead of being provided for each sensor pixel SPXL described with reference to FIG. 5.

In this case, the number of transistors provided in the sensor array PS_2 (or input sensing device) may be reduced.

The i+1-th sensor pixel SPXLi+1 may be included in a different sensor pixel group from the k-th sensor pixel group G_SPXLk, and may include the i+1-th optical sensor PSCi+1, and the first transistor T1 connected between the third sub-line RX_S3 and the fourth sub-line RX_S4, similar to the i−1-th sensor pixel SPXLi−1.

As described with reference to FIG. 9A, the sensor pixel group (or each of the sensor pixel groups) including a plurality of sensor pixels may include a pair of first and second transistors T1 and T2. Therefore, the number of the first and second transistors T1 and T2 provided in the sensor array PS_-2 may be reduced, and thus manufacturing cost may be reduced. Furthermore, an integration density of the sensor pixel may be increased.

In FIG. 9A, the i−1-th sensor pixel SPXLi−1 (or i−1-th optical sensor PSCi−1) and the i-th sensor pixel SPXLi (or i-th optical sensor PSCi) in the k-th sensor pixel group G_SPXLk is shown to be electrically connected through the second sub-line RX_S2, but the configuration of the k-th sensor pixel group G_SPXLk is not limited thereto. For example, as shown in FIG. 9B, the j-th signal line RXj may include only the first sub-line RX_S1 and the third sub-line RX_S3 (e.g., odd numbered sub-lines), and may not include the second sub-line RX_S2 and the fourth sub-line RX_S4 (e.g., even numbered sub-lines, or sub-lines not directly connected to the j-th output line Vj). Thus, and the i−1-th sensor pixel SPXLi−1 and the i-th sensor pixel SPXLi in the k-th sensor pixel group G_SPXLk may not be directly connected to each other.

Figure 10:
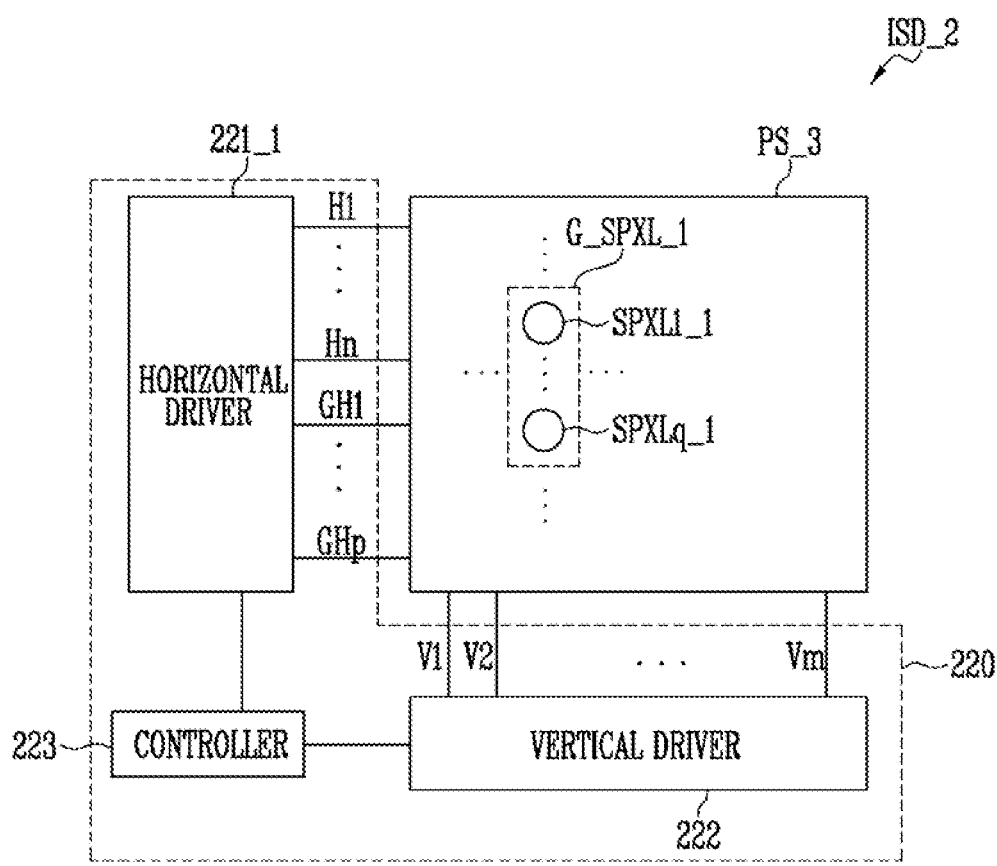
FIG. 10 is a block diagram showing another exemplary embodiment of an input sensing device included in the display device of FIG. 1A.

FIG. 10 is a block diagram showing another exemplary embodiment of an input sensing device included in the display device of FIG. 1A. An input sensing device ISD_2 may include a sensor array PS_3 and an input detector 220.

Referring to FIGS. 1A, 3 and 10, the input sensing device ISD_2 of FIG. 10 is different from the input sensing device ISD of FIG. 3 in that it include a sensor array PS_3, a horizontal driver 221_1, and a group driving lines GH1 to GHp (here p is a positive integer less than n). Since the input sensing device ISD_2 of FIG. 10 is substantially equivalent or similar to the input sensing device ISD of FIG. 3 except for the sensor array PS_3, the horizontal driver 221_1, and the group driving lines GH1 to GHp, redundant descriptions will not be repeated.

The sensor array PS_3 may include a sensor pixel group G_SPXL_1 (or sensor pixel groups), and the sensor pixel group G_SPXL_1 may include a plurality of sensor pixels SPXL1_1 to SPXLq_1 (here q is an integer of 2 or more).

A specific configuration of sensor pixels SPXL1_1 to SPXLq_1 in the sensor pixel group G_SPXL_1 will be described later with reference to FIG. 11.

The horizontal driver 221_1 may be connected to the sensor pixel group G_SPXL_1 through the group driving lines GH1 to GHp (or second driving lines). The horizontal driver 2211 may be composed of a shift register, an address decoder, etc., and may sequentially apply the group driving signal (or group driving signals, or first driving signals) to the group driving lines GH1 to GHp. Here, the group driving signal may be a signal for selectively driving the sensor pixel group G_SPXL_1. The sensor pixels SPXL1_1 to SPXLq_1 included in the sensor pixel group G_SPXL_1 may receive the same group driving signal.

In addition, the horizontal driver 221_1 may be connected to the sensor pixels SPXL1_1 to SPXLq_1 through driving lines H1 to Hn (or first driving lines). The horizontal driver 221_1 may sequentially apply the driving signal (or driving signals, or second driving signals) to the driving lines H1 to Hn.

Each of the sensor pixels SPXL1_1 to SPXLq_1 selected by the group driving signal and the driving signal provided from the horizontal driver 221_1 may sense light by using a photoelectric element therein, and may output an electrical signal corresponding to the sensed light.

Figure 11:
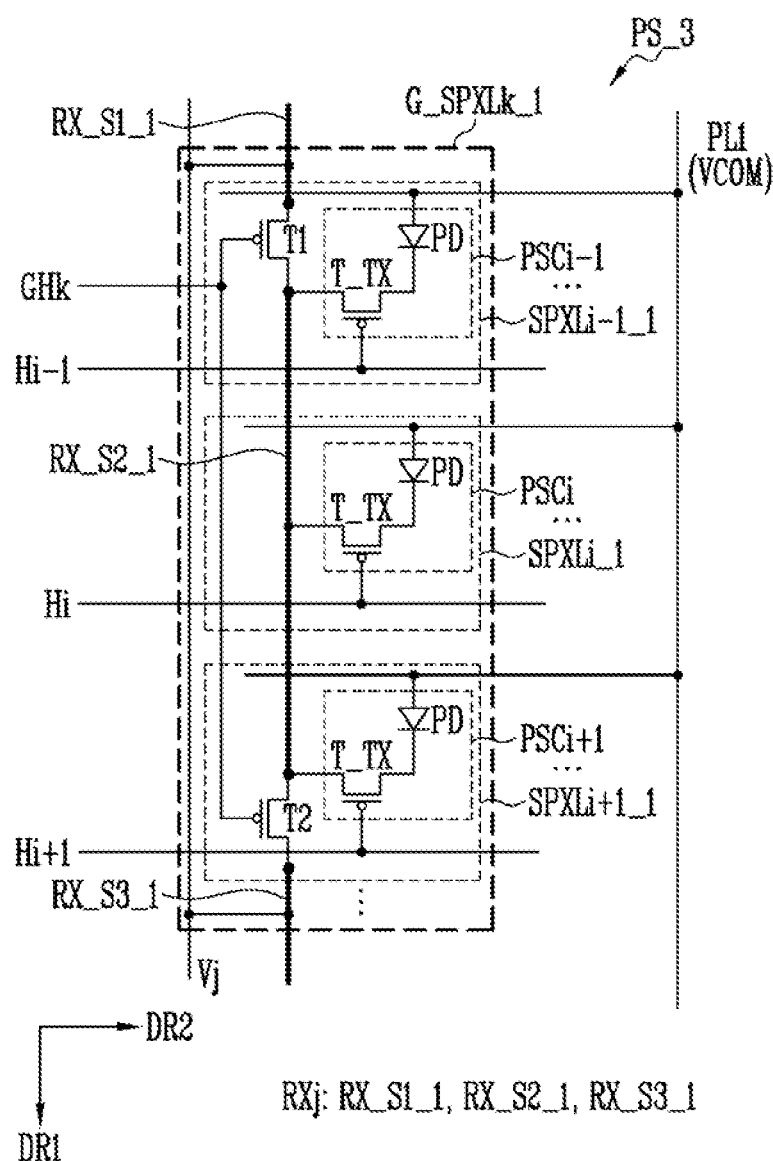
FIG. 11 is a circuit diagram showing an exemplary embodiment of a sensor array included in the input sensing device of FIG. 10.

FIG. 11 is a circuit diagram showing an exemplary embodiment of a sensor array included in the input sensing device of FIG. 10. In FIG. 11, sensor pixels SPXLi−1_1, SPXLi_1, and SPXLi+1_1 included in the k-th sensor pixel group G_SPXLk_1 (here k is a positive integer) and included in the i−1-th to i+1-th sensor pixel rows and the j-th sensor pixel column, are shown.

Referring to FIG. 11, the k-th sensor pixel group G_SPXLk_1 may include an i−1-th sensor pixel SPXLi−1_1, an i-th sensor pixel SPXLi_1, and an i+1-th sensor pixel SPXLi+1_1. In other words, the k-th sensor pixel group G_SPXLk_1 may include three sensor pixels SPXLi−1_1, SPXLi_1, and SPXLi+1_1. However, this is just an example, and the number of sensor pixels included in the k-th sensor pixel group G_SPXLk_1 is not limited thereto. For example, the number of sensor pixels included in the k-th sensor pixel group G_SPXLk_1 may be two, or four or more.

The i−1-th sensor pixel SPXLi−1_1 may include an i−1-th optical sensor PSCi−1 and a first transistor T1.

The i−1-th optical sensor PSCi−1 may be connected to the power line PL1, the i−1-th driving line Hi−1, and the second sub-line RX_S2_1, and may be driven in response to a driving signal provided through the i−1-th driving line Hi−1. Since the i−1-th optical sensor PSCi−1 is substantially equivalent to the i−1-th optical sensor PSCi−1 described with reference to FIG. 9A, redundant descriptions will not be repeated. The first sub-line RX_S1_1, the second sub-line RX_S2_1, and the third sub-line RX_S3_1 may be included in the j-th signal line RXj.

A first transistor T1 of the i−1-th sensor pixel SPXLi−1_1 may include a first electrode connected to the first sub-line RX_S1_1, a second electrode connected to the second sub-line RX_S2_1 (or a second electrode of the transmission transistor T_TX in the i−1-th optical sensor PSCi−1), and a gate electrode connected to the k-th group driving line GHk.

The i-th sensor pixel SPXLi_1 may include an i-th optical sensor PSCi, and may not include first and second transistors T1 and T2.

The i-th optical sensor PSCi may be connected to the power line PL1, the i-th driving line Hi, and the second sub-line RX_S2_1, and may be driven in response to a driving signal provided through the i-th driving line Hi. The i-th optical sensor PSCi may be substantially equivalent to the i−1-th optical sensor PSCi−1. Since the i-th sensor pixel SPXLi_1 does not include the first and second transistors T1 and T2, the transmission transistor T_TX in the i-th optical sensor PSCi may be directly connected to the second sub-line RX_S2_1 and to transmission transistor T_TX of the i−1-th optical sensor PSCi−1 and the transmission transistor T_TX of the i+1-th optical sensor PSCi+1.

The i+1-th sensor pixel SPXLi+1_1 may include an i+1-th optical sensor PSCi+1 and the second transistor T2.

The i+1-th optical sensor PSCi+1 may be connected to the power line PL1, the i+1-th driving line Hi+1, and the second sub-line RX_S2_1, and may be driven in response to a driving signal provided through the i+1-th driving line Hi+1. The i+1-th optical sensor PSCi+1 may be substantially equivalent or similar to the i-th optical sensor PSCi described with reference to FIG. 9A.

In this case, the i−1-th optical sensor PSCi−1 (or the i−1-th sensor pixel SPXLi−1_1), the i-th optical sensor PSCi (or the i-th sensor pixel SPXLi_1), and the i+1-th optical sensor PSCi+1 (or the i+1-th sensor pixel SPXLi+1_1) may be directly connected to each other through the second sub-line RX_S2_1, and a separate transistor for connecting or disconnecting them, may not be disposed among the i−1-th optical sensor PSCi−1, the i-th optical sensor PSCi, and the i+1-th optical sensor PSCi+1.

A second transistor T2 of the i+1-th sensor pixel SPXLi+1_1 may include a first electrode connected to the second sub-line RX_S2_1 (or a second electrode of the transmission transistor T_TX in the i+1-th optical sensor PSCi+1), a second electrode connected to the third sub-line RX_S3_1, and a gate electrode connected to the k-th group driving line GHk.

The j-th output line $V_j$ may be connected to the first sub-line RX_S1_1 and the third sub-line RX_S3_1, and may not be directly connected to the second sub-line RX_S2_1.

In this case, the first transistor T1 and the second transistor T2 for performing the noise prevention function for the j-th signal line RXj may be provided for each sensor pixel group (e.g., a sensor pixel group including three sensor pixels).

An operation of each of the k-th sensor pixel group G_SPXLk_1 and the i−1-th sensor pixel SPXLi−1_1, the i-th sensor pixel SPXLi_1, and the i+1-th sensor pixel SPXLi+1_1 included therein may be described with reference to FIG. 12.

Figure 12:
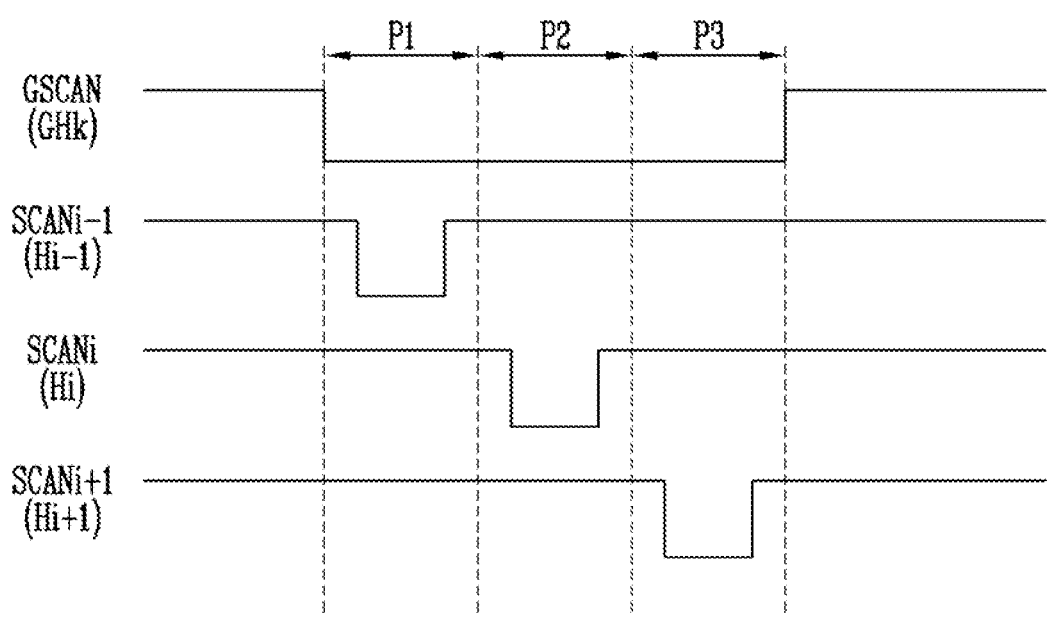
FIG. 12 is a waveform diagram describing an operation of the sensor array of FIG. 11, according to an exemplary embodiment of the present invention.

FIG. 12 is a waveform diagram describing an operation of the sensor array of FIG. 11, according to an exemplary embodiment of the present invention.

Referring to FIGS. 11 and 12, a group driving signal GSCAN (or a first driving signal) may be provided to the k-th group driving line GHk (or a first driving line), an i−1-th driving signal SCANi−1 (or, a second driving signal) may be provided to the i−1-th driving line Hi−1, an i-th driving signal SCAN may be provided to the i-th driving line Hi, and an i+1-th driving signal SCANi+1 may be provided to the i+1-th driving line Hi+1.

In a first period P1, a second period P2, and a third period P3, the group driving signal GSCAN may have a logic low level (or a gate-on voltage level). In a period other than the first to third period P1 to P3, the group driving signal GSCAN may have a logic high level (or a gate-off voltage level).

When the group driving signal GSCAN of the logical high level is provided to the k-th group driving line GHk (or when the group driving signal GSCAN is not provided to the k-th group driving line GHk), the first transistor T1 and the second transistor T2 in the k-th sensor pixel group G_SPXLk_1 may maintain a turn-off state, and may electrically separate the i−1-th sensor pixel SPXLi−1_1, the i-th sensor pixel SPXLi_1, and the i+1-th sensor pixel SPXLi+1_1 (and second sub-line RX_S2_1) from the first sub-line RX_S1_1 and the third sub-line RX_S3_1 (and the j-th output line Vj). In particular, the first sub-line RX_S1_1, the second sub-line RX_S2_1, and the third sub-line RX_S3_1 may be electrically separated from each other, and thus the possibility that noise flows through the j-th signal line RXj and a size of the noise may be reduced.

When the group driving signal GSCAN of the logic low level is provided to the k-th group driving line GHk, the first transistor T1 and the second transistor T2 in the k-th sensor pixel group G_SPXLk_1 may be turned on, and may electrically connect the i−1-th sensor pixel SPXLi−1_1, the i-th sensor pixel SPXLi_1, and the i+1-th sensor pixel SPXLi+1_1 to the j-th output line Vj through the second sub-line RX_S2_1. In this case, other sensor pixel groups (and sub-lines corresponding thereto) except for the k-th sensor pixel group G_SPXLk_1 may maintain a state electrically separated from the j-th output line Vj.

In the first period P1, the i−1-th driving signal SCANi−1 may have a logic low level, and, as described with reference to FIG. 6, a photoelectrically converted charge (or a sensing signal) from the i−1-th sensor pixel SPXLi−1_1 (or the i−1-th optical sensor PSCi−1) may be transferred to the j-th output line Vj through the second sub-line RX_S2_1, the first and second transistors T1 and T2, and the first and third sub-lines RX_S1_1 and RX_S3_1.

Similarly, in the second period P2, after the first period P1, the i-th driving signal SCANi may have a logic low level, and the photoelectrically converted charge from the i-th sensor pixel SPXLi_1 (or the i-th optical sensor PSCi) may be transferred to the j-th output line Vj through the second sub-line RX_S2_1, the first and second transistors T1 and T2, and the first and third sub-lines RX_S1_1 and RX_S3_1.

In the third period P3, after the first and second periods P1 and P2, the i+1-th driving signal SCANi+1 may have a logic low level, and the photoelectrically converted charge from the i+1-th sensor pixel SPXLi+1_1 (or the i+1-th optical sensor PSCi+1) may be transferred to the j-th output line Vj.

As described with reference to FIGS. 11 and 12, the sensor pixel group including a plurality of sensor pixels may include a pair of first and second transistors T1 and T2. Therefore, the number of the first and second transistors T1 and T2 provided in the sensor array PS_3 may be reduced, and thus the manufacturing cost may be reduced, or the integration density of the sensor pixel may be increased.

In addition, when the k-th sensor pixel group G_SPXLk_1 includes two sensor pixels, the i-th sensor pixel SPXLi_1 may be omitted in the k-th sensor pixel group G_SPXLk_1. In other words, the k-th sensor pixel group G_SPXLk_1 may include only two sensor pixels corresponding to the i−1-th sensor pixel SPXLi−1_1 and the i+1-th sensor pixel SPXLi+1_1.

Alternatively, when the k-th sensor pixel group G_SPXLk_1 includes four or more sensor pixels, a plurality of i-th sensor pixels SPXLi_1 may be provided in the k-th sensor pixel group G_SPXLk_1. In other words, the k-th sensor pixel group G_SPXLk_1 may include two or more sensor pixels substantially equivalent to the i-th sensor pixel SPXLi_1 between the i−1-th sensor pixel SPXLi−1_1 and the i+1-th sensor pixel SPXLi+1_1.

An input sensing device according to exemplary embodiments of the present invention and a display device including the same may reduce or block noise and leakage current that flows through the first signal line by including first and second transistors connected between sub-lines (or the first signal line) to which optical sensors are connected. Therefore, the sensing sensitivity of the input sensing device and the display device including the same can be increased.

While the present invention has been described with reference to exemplary embodiments thereof, those skilled in the art will appreciate that various changes in form and details may be made thereto without departing from the spirit and scope of the present invention as set forth in the following claims.

What is claimed is:
1. An input sensing device, comprising:
a power line;
driving lines;
a first signal line including sub-lines;
a second signal line connected to the sub-limes; and
sensor pixels connected to the power line, the driving lines, and the first signal line,
wherein at least one sensor pixel of the sensor pixels includes:
an optical sensor that transfers a photoelectrically converted charge from the power, line to a first node in response to a driving signal provided through a first driving line of the driving lines;
a first transistor connected between the first node and a first sub-line among the sub-lines, wherein the first transistor includes a gate electrode connected to the first driving line; and
a second transistor connected between the first node and a second sub-line among the sub-lines, wherein the second transistor includes a gate electrode connected to the first driving line.

2. The input sensing device of claim 1, wherein the optical sensor includes:
a photodiode connected between the power line and the first node; and
a transmission transistor connected between the photodiode and the first node, wherein the transmission transistor includes a gate electrode connected to the first driving line.

3. The input sensing device of claim 1, wherein the sub-lines extend in a first direction and are arranged along the first direction,
wherein the second signal line is arranged parallel to the first signal line, and
wherein the driving lines extend in a second direction crossing the first direction and are arranged along the first direction.

4. The input sensing device of claim 3, wherein the second signal line is connected to each of the first sub-line and the second sub-line.

5. The input sensing device of claim 3, wherein a width of the second signal line is greater than a width of the first signal line.

6. The input sensing device of claim 1, further comprising:
a first driver connected to the driving lines, wherein the first driver sequentially supplies the driving signal to the driving lines; and
a second driver connected to the second signal line.

7. The input sensing device of claim 6, wherein a sensor pixel farthest from the second driver among the sensor pixels, includes an optical sensor and only one transistor directly connected to the first signal line.

8. The input sensing device of claim 6, wherein a sensor pixel closest to the second driver among the sensor pixels, includes an optical sensor and only one transistor directly connected to the first signal line.

9. An input sensing device, comprising
a power line;
a first driving line;
a first signal line including a first sub-line and a second sub-line;
a second signal line connected to the first sub-line and the second sub-line;
optical sensor connected between the power line and a first node;
a first transistor connected between the first node and the first sub-line; and
a second transistor connected between the first node and the second sub-line,
wherein a gate electrode of the first transistor is connected to the first driving line and a gate electrode of the second transistor is connected to the first driving line.

10. The input sensing device of claim 9, wherein the first node is directly connected to the first transistor and the second transistor.

11. The input sensing device of claim 9, wherein the first sub-line is electrically connected to the second sub-line by the first transistor and the second transistor.

12. An input sensing device, comprising:
- a power line;
- a first driving line;
- a first signal line including a first sub-line and a second sub-line;
- a second signal line connected to the first sub-line and the second sub-line;
- an optical sensor connected between the power line and a first node;
- a first transistor connected between the first node and the first sub-line; and
- a second transistor connected between the first node and the second sub-line,
- wherein a width of the second signal line is greater than a width of the first signal line.

\* \* \* \* \*